US011435671B2

(12) United States Patent
Kooiman

(10) Patent No.: US 11,435,671 B2
(45) Date of Patent: Sep. 6, 2022

(54) SEM FOV FINGERPRINT IN STOCHASTIC EPE AND PLACEMENT MEASUREMENTS IN LARGE FOV SEM DEVICES

(71) Applicant: ASML NETHERLANDS B.V., Veldhoven (NL)

(72) Inventor: Marleen Kooiman, Eindhoven (NL)

(73) Assignee: ASML Netherlands B.V., Veldhoven (NL)

(*) Notice: Subject to any disclaimer, the term of this patent is extended or adjusted under 35 U.S.C. 154(b) by 474 days.

(21) Appl. No.: 16/690,633

(22) Filed: Nov. 21, 2019

(65) Prior Publication Data
US 2020/0173940 A1 Jun. 4, 2020

(30) Foreign Application Priority Data

Dec. 4, 2018 (EP) ..................... 18210026

(51) Int. Cl.
*G03F 7/20* (2006.01)
*G01N 23/2251* (2018.01)
(Continued)

(52) U.S. Cl.
CPC ..... *G03F 7/70625* (2013.01); *G01N 23/2251* (2013.01); *G03F 7/7065* (2013.01);
(Continued)

(58) Field of Classification Search
CPC ............ G03F 7/70625; G03F 7/70616; G03F 7/7065; G01N 23/2251; H01J 37/265; H01J 37/285; H01J 2237/221; H01J 2237/2817; G06T 2207/10061; G06T 2207/30148; G06T 2207/30168
See application file for complete search history.

(56) References Cited

U.S. PATENT DOCUMENTS 5,229,872 A 7/1993 Mumola
6,046,792 A 4/2000 Van Der Werf et al.
(Continued)

FOREIGN PATENT DOCUMENTS

EP 0808477 5/2000
WO 2017060192 4/2017

OTHER PUBLICATIONS

Extended European Search Report issued in corresponding European Patent Application No. 18210026.3, dated Jun. 13, 2019.
(Continued)

*Primary Examiner* — Nicole M Ippolito
*Assistant Examiner* — Hanway Chang
(74) *Attorney, Agent, or Firm* — Pillsbury Winthrop Shaw Pittman LLP

(57) ABSTRACT

A method of reducing variability of an error associated with a structure on a substrate in a lithography process is disclosed. The method includes determining, based on one or more images obtained based on a scan of the substrate by a scanning electron microscope (SEM), a first error due to a SEM distortion in the image. The method also includes determining, based on the image, a second error associated with a real error of the structure, where the error associated with the structure includes the first error and the second error. A command is generated by a data processor that enables a modification of the lithography process and an associated reduction of the variability of the error based on reducing any of the first error or the second error.

20 Claims, 16 Drawing Sheets

(51) Int. Cl.
*H01J 37/26* (2006.01)
*H01J 37/285* (2006.01)

(52) U.S. Cl.
CPC ........ *G03F 7/70616* (2013.01); *H01J 37/265* (2013.01); *H01J 37/285* (2013.01); *G06T 2207/10061* (2013.01); *G06T 2207/30148* (2013.01); *G06T 2207/30168* (2013.01); *H01J 2237/221* (2013.01); *H01J 2237/2817* (2013.01)

(56) References Cited

U.S. PATENT DOCUMENTS

| | | |
|---|---|---|
| 7,473,502 B1 | 1/2009 | Ausschnitt et al. |
| 7,587,704 B2 | 9/2009 | Ye et al. |
| 2007/0031745 A1 | 2/2007 | Ye et al. |
| 2007/0050749 A1 | 3/2007 | Ye et al. |
| 2008/0210867 A1 | 9/2008 | Hitomi et al. |
| 2008/0301620 A1 | 12/2008 | Ye et al. |
| 2008/0309897 A1 | 12/2008 | Wong et al. |
| 2009/0157360 A1 | 6/2009 | Ye et al. |
| 2009/0218491 A1 | 9/2009 | Morokuma et al. |
| 2010/0162197 A1 | 6/2010 | Ye et al. |
| 2010/0180251 A1 | 7/2010 | Ye et al. |
| 2018/0053627 A1 | 2/2018 | Phaneuf et al. |
| 2018/0081278 A1 | 3/2018 | Nikipelov et al. |

OTHER PUBLICATIONS

Mulkens, Jan et al.: "Holistic approach for overlay and edge placement error to meet the 5nm technology node requirements", Proc. of SPIE, vol. 10585, Mar. 18, 2018.

Dillen, Harm et al.: "CD-SEM distortion quantification for EPE metrology and contour analysis", Proc. of SPIE, vol. 10145, Mar. 28, 2017.

International Search Report issued in corresponding PCT Patent Application No. PCT/EP2019/081425, dated Feb. 4, 2020.

SEM FOV FINGERPRINT IN STOCHASTIC EPE AND PLACEMENT MEASUREMENTS IN LARGE FOV SEM DEVICES

This application claims priority of European Patent Application No. 18210026.3, filed on Dec. 4, 2018, and which is incorporated herein in its entirety by reference.

TECHNICAL FIELD

The description herein relates generally to improving measurements of a printed pattern. More particularly, the disclosure includes apparatus, methods, and computer programs for isolating and identifying apparent errors in measurements that are due to an image capture device.

BACKGROUND

Manufacturing semiconductor devices typically involves processing a substrate (e.g., a semiconductor wafer) using a number of fabrication processes to form various features and multiple layers of the semiconductor device. Such layers and features are typically manufactured and processed using, e.g., deposition, lithography, etch, chemical-mechanical polishing, and ion implantation. Multiple devices may be fabricated on different locations on a substrate and then separated into individual devices. This device manufacturing process may be considered a patterning process. A patterning process can include a patterning step to transfer a pattern from a patterning device to the substrate. Also, there can then be one or more related pattern processing steps, such as resist development by a development apparatus, baking of the substrate using a bake tool, etching the pattern onto the substrate using an etch apparatus, etc.

SUMMARY

A method of reducing variability of an error associated with a structure on a substrate in a lithography process is disclosed. The method includes determining, based on an image (or images) obtained based on a scan of the substrate by a scanning electron microscope (SEM), a first error due to a SEM distortion in the image. The method also includes determining, based on the image, a second error associated with a real error of the structure, where the error associated with the structure comprises the first error and the second error. A command is generated by a data processor that enables a modification of the lithography process and an associated reduction of the variability of the error based on reducing any of the first error or the second error.

In certain variations, the determining, based on the image obtained based on the scan of the substrate by the SEM, of the first error can include determining, based on a number of images obtained based on the scan of the substrate by the SEM, the first error. Also, the determining, based on the image, of the second error associated with the real error of the structure can include determining, based on the plurality of images, the second error associated with the real error of the structure.

In some variations, the SEM distortion can be due to any of: an artifact in the electron imaging, vibrations in the SEM system, or artifacts in the electron detection. Also, the structure can be any of: a main feature or a contact hole. The real error can be a difference between a feature on the structure and a corresponding feature in a target pattern. The feature can be any of: an edge placement gauge, a contact hole center, or a critical dimension.

In other variations, the method can include decomposing the first error into a time-constant error or a time-dependent error. This can also include removing any of the time-constant error or the time-dependent error from the first error to reduce the error.

In yet other variations, the first error or the second error can be mean square errors and the variability of the error can be a standard deviation of the error or a variance of the error.

In further variations, an edge detection algorithm can generate a contour on a portion of the structure and the error can be determined based on a difference between the contour and a corresponding feature in a target pattern.

In some variations, the error can be determined in part by averaging local errors corresponding to neighboring features in a field of view of the SEM. The local errors can be weighted according to a weighted average of the local errors and centered at a center of the neighboring features. The local errors can be weighted according to a Gaussian distribution centered at a center of the plurality of neighboring features.

In other variations, the method can include generating a real residual displacement by at least removing the first error associated with the SEM distortion and flagging a feature of the structure when a portion of the real residual displacement associated with the feature exceeds a threshold.

In yet other variations, the method can include monitoring, with the data processor or another data processor, images acquired by the SEM, determining whether the error exceeds a threshold, generating, when the threshold is exceeded, any of: an alert to a user to recalibrate the SEM, a command causing the SEM to automatically recalibrate, or an instruction that modifies the operation of the SEM to reduce the error.

In some variations, modifying the lithography process can include any of: changing a focus of a light source used to manufacture the substrate, modifying parameters used in a source-mask optimization, modifying a number of light sources used in the lithography process, or modifying a configuration of mirrors on a digital mirror device.

In an interrelated aspect, a method of reducing variability of an error associated with a structure on a substrate in a lithography process can include determining, based on an image obtained based on a scan of the substrate by a scanning electron microscope (SEM), a first error due to a SEM distortion in the image and generating, by a data processor, a command that enables a modification of the lithography process and an associated reduction of the variability of the error based on reducing the first error.

Also disclosed is computer program product comprising a non-transitory computer readable medium having instructions recorded thereon, the instructions when executed by a computer implementing any of the methods described herein.

In another interrelated aspect, a system includes a SEM configured to scan a substrate with an electron beam and generate an image of the substrate, the image indicating an error associated with a structure on the substrate. The system also includes a non-transitory machine-readable medium storing instructions which, when executed by a data processor, cause the data processor to perform operations including determining, based on the image obtained based on the scan of the substrate by a scanning electron microscope (SEM), a first error due to a SEM distortion in the image and generating, by the data processor, a command that enables a modification of a lithography process and an associated reduction of a variability of the error based on reducing the first error.

In some variations, the operations can further include adjusting, by the data processor, an operational parameter of the SEM to reduce an effect of a lens aberration, wherein the operational parameter can be any of: a beam energy, a focus of the SEM beam, or a scan speed, and where the reducing of the effect causes the associated reduction in the variability of the error. Also, operations can further include automatically refining, by the data processor, a positioning grid calibration of the SEM in response to analysis of the SEM distortion. The operations can further include generating, by the data processor, a command that causes an automatic recalibration of the SEM.

BRIEF DESCRIPTION OF THE DRAWINGS

The accompanying drawings, which are incorporated in and constitute a part of this specification, show certain aspects of the subject matter disclosed herein and, together with the description, help explain some of the principles associated with the disclosed implementations. In the drawings, FIG. 1 schematically depicts an embodiment of an electron beam inspection apparatus, according to an embodiment.

DETAILED DESCRIPTION

When manufacturing a computer chip or other type of integrated circuit, in some cases, extremely small structures are formed on a silicon substrate. These structures can include transistors, which do the "thinking" of the computer chip, and metal wires that are used to connect the transistors. These structures are extremely small, for example, 1000 metal wires placed side by side can fit within the width of a human hair. A computer chip can have several layers of metal wires, one on top of the other, with some layers running primarily in a north/south direction, and other layers running primarily in an east/west direction. A metal wire on a first layer may be connected to a metal wire on a second layer by a contact hole cut between the two layers that is filled with metal. With the incredibly small dimensions of these wires and contact holes, they must be placed (also referred to as aligned) very precisely, or they will not line up properly. Even the smallest amount of misalignment will cause the connection from the first wire to the second wire via the contact hole metal to fail, which can cause the entire computer chip to fail and become worthless.

Lithography is a process that is involved in the formation of these structures. The quality of a lithography process can be assessed with, for example, a scanning electron microscope (SEM). A SEM can be used to image these extremely small structures, in effect, taking a "picture" of the structures. The image can be used to determine if the structure was formed properly and also if it was formed in the proper location. Again, even small errors in the formation or placement of the structure may cause the computer chip to fail. However, the errors indicated by the image may be "real" or may be "false." For example, when the SEM images the structure, the image may be distorted, which can cause the structure to appear deformed or misplaced, when, in reality, the issue is the distortion of the image and not any real error in the formation or placement of the structure.

This disclosure describes, for example, methods for analyzing the SEM images to distinguish between real errors and SEM distortions. When an apparent error is identified as caused by the SEM, the SEM can be adjusted to reduce the apparent error. Furthermore, if the real errors are accurately identified then the steps in the lithography process can be modified to reduce these real errors. In this way, not only can the final product be improved by knowing the real errors, but also the efficiency of the lithography process can be improved by removing "false" errors that may be suggested based on distorted SEM images. For example, a technician may not need to waste time by determining errors that happen to be "false." More importantly, the technician can avoid correcting "false" errors. Correction of a "false" error could lead to actually making the lithography process worse by introducing a new (and real) error into the process.

Figure 1:
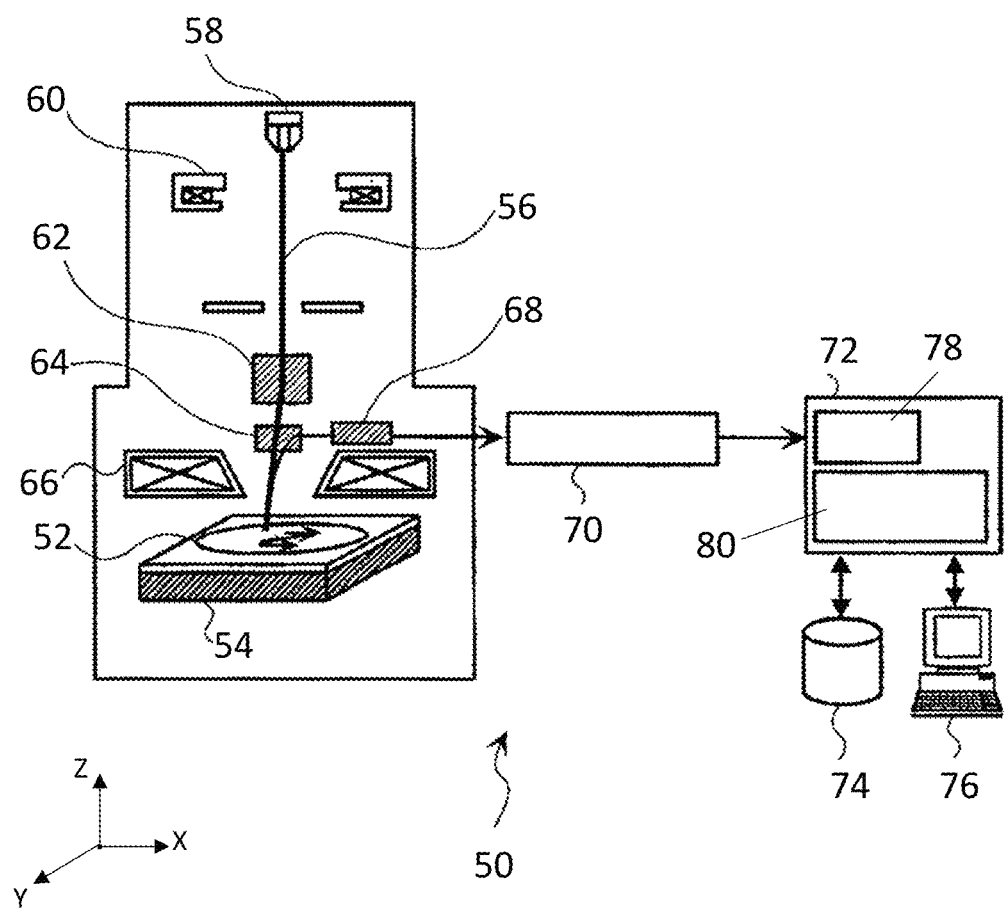

In some embodiments, images of a substrates or other printed patterns can be obtained from an image capture device, for example, a scanning electron microscope (also referred to as an electron beam inspection system). Exemplary embodiments of an electron beam inspection system are described in further detail with reference to FIGS. 1 and 2. In some cases, the electron beam inspection system can be similar to scanning electron microscope but have a large field of view (LFOV) and high throughput for obtaining measured images. In some embodiments, a LFOV can measure, on a side, for example, approximately 1-1000 microns, 100-500 microns, 1-50 microns, 6-12 microns, etc.

Figure 2:
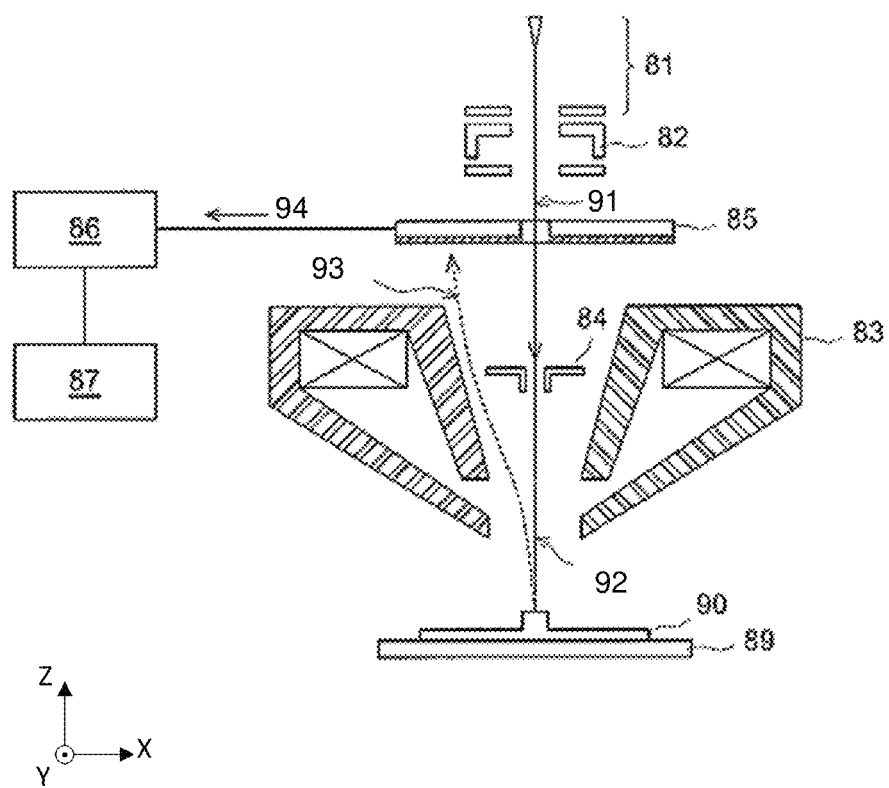
FIG. 2 schematically illustrates a further embodiment of an inspection apparatus, according to an embodiment.

FIG. 2 schematically depicts an embodiment of inspection apparatus 50, according to an embodiment. In an embodiment, inspection apparatus 50 may be an electron beam inspection apparatus (e.g., the same as or similar to a scanning electron microscope) that yields an image of a structure on the substrate.

In operation, a primary electron beam 56 emitted from an electron source 58 is converged by condenser lens 60 and then passes through a beam deflector 62, an E×B deflector 64, and an objective lens 66 to irradiate a substrate 52 on a substrate table 54 at a focus. When the substrate 52 is irradiated with electron beam 56, secondary electrons are generated from the substrate 52. The secondary electrons are deflected by the E×B deflector 64 and detected by a secondary electron detector 68. A two-dimensional electron beam image can be obtained by detecting the electrons generated from the sample in synchronization with, e.g., two-dimensional scanning of the electron beam by beam deflector 62 or with repetitive scanning of electron beam 56 by beam deflector 62 in an X or Y direction, together with continuous movement of the substrate 52 by the substrate table 54 in the other of the X or Y direction. Thus, in an embodiment, the electron beam inspection apparatus has a field of view for the electron beam defined by the angular range into which the electron beam can be provided by the electron beam inspection apparatus (e.g., the angular range through which the deflector 62 can provide the electron beam 56). Thus, the spatial extent of the field of the view is the spatial extent to which the angular range of the electron beam can impinge on a surface (wherein the surface can be stationary or can move with respect to the field).

A signal detected by secondary electron detector 68 is converted to a digital signal by an analog/digital (ND) converter 70, and the digital signal is sent to an image processing system 72. In an embodiment, the image processing system 72 may have memory 78 to store all or part of digital images for processing by a processing unit 80. The processing unit 80 (e.g., specially designed hardware or a combination of hardware and software or a computer readable medium comprising software) is configured to convert or process the digital images into datasets representative of the digital images. In an embodiment, the processing unit 80 is configured or programmed to cause execution of a method described herein. Further, image processing system 72 may have a storage medium 78 configured to store the digital images and corresponding datasets in a reference database. A display device 76 may be connected with the image processing system 72, so that an operator can conduct necessary operation of the equipment with the help of a graphical user interface.

Figure 3:
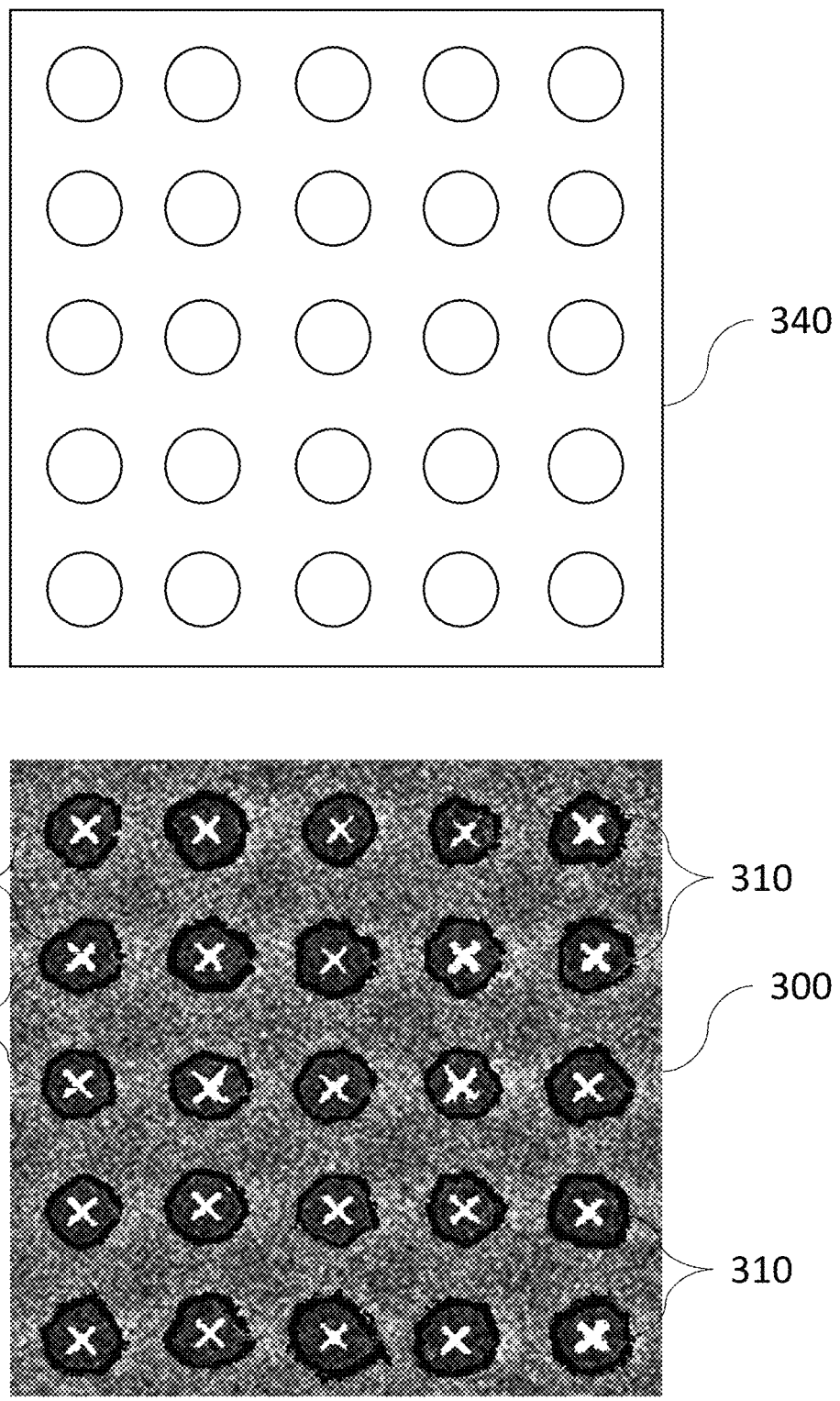
FIG. 3 schematically depicts an exemplary SEM image associated with a target pattern, according to an embodiment.

FIG. 3 schematically illustrates a further embodiment of an inspection apparatus, according to an embodiment. The system is used to inspect a sample 90 (such as a substrate) on a sample stage 88 and comprises a charged particle beam generator 81, a condenser lens module 82, a probe forming objective lens module 83, a charged particle beam deflection module 84, a secondary charged particle detector module 85, and an image forming module 86.

The charged particle beam generator 81 generates a primary charged particle beam 91. The condenser lens module 82 condenses the generated primary charged particle beam 91. The probe forming objective lens module 83 focuses the condensed primary charged particle beam into a charged particle beam probe 92. The charged particle beam deflection module 84 scans the formed charged particle beam probe 92 across the surface of an area of interest on the sample 90 secured on the sample stage 88. In an embodiment, the charged particle beam generator 81, the condenser lens module 82 and the probe forming objective lens module 83, or their equivalent designs, alternatives or any combination thereof, together form a charged particle beam probe generator which generates the scanning charged particle beam probe 92.

The secondary charged particle detector module 85 detects secondary charged particles 93 emitted from the sample surface (maybe also along with other reflected or scattered charged particles from the sample surface) upon being bombarded by the charged particle beam probe 92 to generate a secondary charged particle detection signal 94. The image forming module 86 (e.g., a computing device) is coupled with the secondary charged particle detector module 85 to receive the secondary charged particle detection signal 94 from the secondary charged particle detector module 85 and accordingly forming at least one scanned image. In an embodiment, the secondary charged particle detector module 85 and image forming module 86, or their equivalent designs, alternatives or any combination thereof, together form an image forming apparatus which forms a scanned image from detected secondary charged particles emitted from sample 90 being bombarded by the charged particle beam probe 92.

In an embodiment, a monitoring module 87 is coupled to the image forming module 86 of the image forming apparatus to monitor, control, etc. the patterning process and/or derive a parameter for patterning process design, control, monitoring, etc. using the scanned image of the sample 90 received from image forming module 86. So, in an embodiment, the monitoring module 87 is configured or programmed to cause execution of a method described herein. In an embodiment, the monitoring module 87 comprises a computing device. In an embodiment, the monitoring module 87 comprises a computer program to provide functionality herein and encoded on a computer readable medium forming, or disposed within, the monitoring module 87.

The electron current in the system of FIG. 3 is significantly larger compared to, e.g., a CD SEM, such that the probe spot is large enough so that the inspection speed can be fast. However, the resolution may not be as high as compared to a CD SEM because of the large probe spot.

FIG. 3 illustrates one example of an image 300 that can be captured by an imaging device such as a SEM, any of the other inspection apparatuses described herein, or any imaging device suitable for imaging printed patterns. As seen in the Figure, SEM image 300 represents a portion of a substrate where a number of contact holes have been formed in the substrate by a lithography process. The contact holes appear darker than remainder the image because the surface found inside the boundary of the contact hole is at a different height and/or of a different material that the surface of the substrate itself. For example, the material inside the contact hole can correspond to an underlayer instead of a resist.

In FIG. 3, the boundaries of the contact holes are shown as darker curves or contours 320 around each of the contact holes. In some implementations, an edge detection algorithm can be used to generate a contour (e.g., as added to the SEM image) on at least a portion of the structure (e.g., a contact hole). The edge detection algorithm can include, for example, determining a gradient or higher derivative in an image to locate an edge, locating an edge based on pixel intensities in the image, etc.

Also seen in FIG. 3 are light colored X's that indicate the calculated centers of the contact holes. Such contact hole centers 330 can be determined based on a centroid of contact hole 310, an intersection of lines based on the largest X or Y extents of contact holes 310 as defined by contours 320, etc. In some implementations, features such as edge coordinates or contact hole centers of the imaged structures can be calculated and used to characterize the structures without necessarily generating a contour either in computer memory or as part of a visualization.

To provide a simplified explanation of the implementations described herein, most examples are provided based on determining errors in structures such as contact holes, rather than for more complex 2D or 3D shapes. However, the disclosed methods applied to any structure formed in a substrate or other material. For example, structures can include main features (e.g., 2D linear structures such as channels), or any other type of physical structures formed in a substrate or other material being analyzed. While FIG. 3 shows an array of contact holes 310, in other implementations, patterns of lines, grids, or other 2D structures can be formed and imaged for metrology purposes or may be part of a finished project that is undergoing quality control or assessment. In this way, the disclosed methods apply to any structure capable of being imaged.

Figure 4:
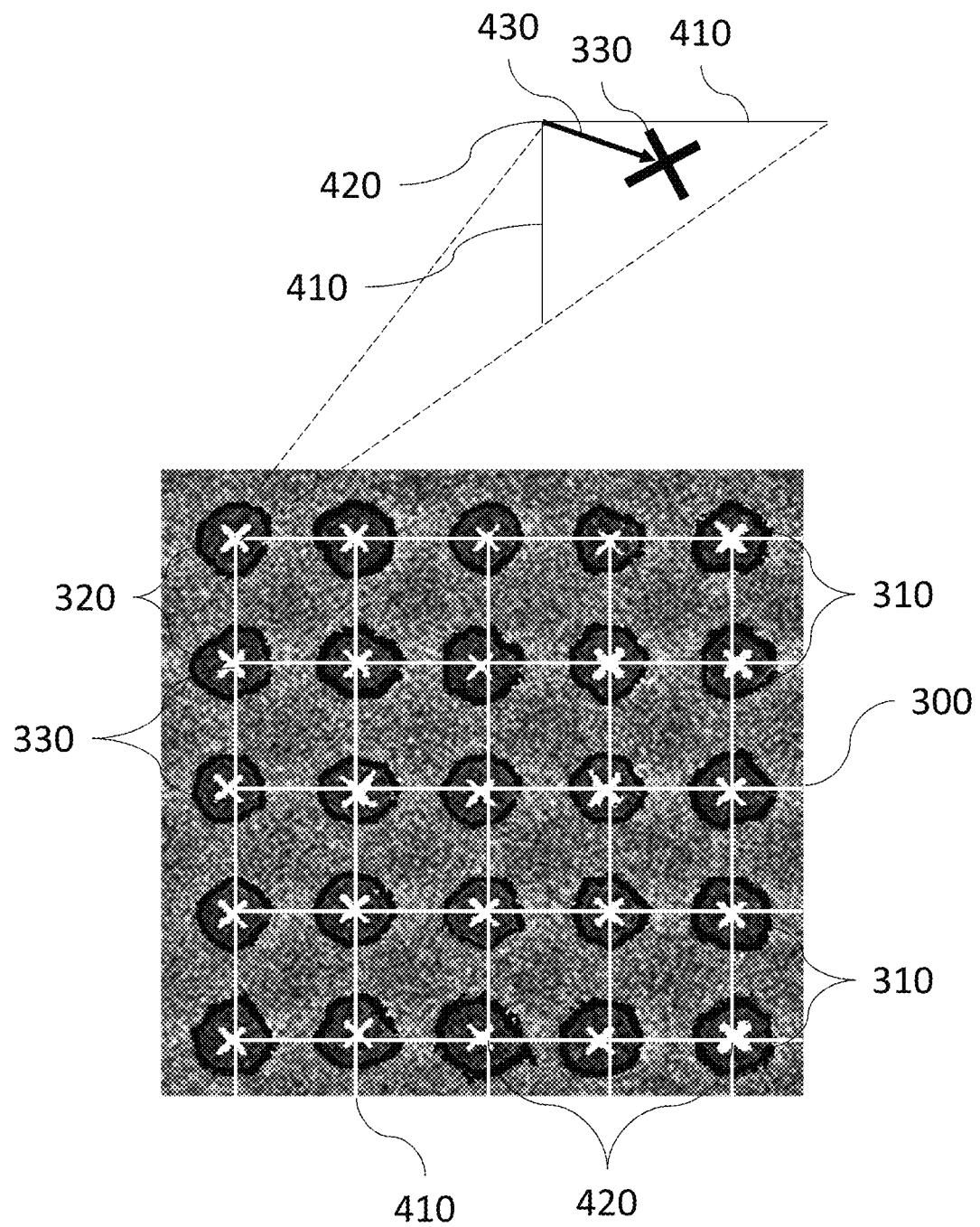
FIG. 4 schematically depicts the exemplary SEM image overlaid with contact hole locations in the target pattern, according to an embodiment.

To determine the difference between SEM images and target patterns, in certain embodiments, the disclosed processes may include or begin with performing an image alignment between the SEM image and the target pattern. This alignment can include, for example, performing any combination of translations in X and Y (or Z for 3D images), symmetric and asymmetric rotations, and symmetric and asymmetric magnification. Such a procedure can be referred to as a six-parameter linear distortion correction and can be performed either on the SEM image or the target pattern. One example of the result of such a linear distortion correction is shown in FIG. 4 where, overlaid onto SEM image is a grid 410 with intersections 420 that illustrates the centers of contact holes in target pattern 340. While the grid intersections 420 appear to generally coincide with contact hole centers 330, upon close inspection (see also the expanded section of one contact hole center 330 shown at the top of the figure) it can be seen that some contact hole centers are at different locations than intended by target pattern 340, as illustrated by the grid intersections 420. Also shown in the expanded section at the top of figure is a vector 430 that illustrates a placement error between the actual contact hole center 330 and the grid intersection 420. The use of this vector is further described below in the discussion of decomposing and identifying the various types of errors captured in the SEM image.

With some of the differences between the contact hole centers and the grid intersections resolved with image alignment, the error analysis can proceed by separating real errors from apparent errors due to SEM distortions. One way to do so is to use higher order polynomial distortions instead of the six-parametric linear distortion correction applied above. Some disadvantages may include:

the higher order terms could be primarily noise-fitting or fitting of the real distortion. This leads to overestimating the distortion contribution (the Analysis of Variances formula, also referred to as ANOVA, corrects for this, see, e.g., equations 8-10);

the overfitting can be overcome by averaging over images, however that implies that the time-dependent SEM distortion cannot be captured and is erroneously identified as substrate variations;

discontinuous jumps in the displacement cannot be modeled. The latter can occur due to mechanical vibrations in the SEM or digital refresh rates. This leads to underestimating the SEM contribution.

As described in further detail herein, some of the disclosed methods can reduce variability of an error associated with a structure on a substrate in a lithography process. In some embodiments, this can include determining, based at least on an image obtained based on a scan of the substrate by a scanning electron microscope, a first error due to a SEM distortion in the image. Optionally, a second error can be determined based on the image with the second error associated with a real error or of the structure. In this way, the total error associated (as measured by the SEM) with the structure can include one or both of the first error (due to SEM distortions) and the second error (the real physical error in structures formed on the substrate).

As used herein, the term "variability of an error" means a variation, scatter, or generally a change in the degree or occurrences of errors associated with a structure of a printed pattern. Also, the term "variability" is distinct from a "variance," which, as used herein, refers to the statistical quantity of the same name.

Also, as used herein, the term "SEM distortion" means any sort of error (or apparent distortion) that results from the errors in the operation, acquisition, or analysis of SEM data. The SEM distortion can be present in an SEM image or in the data that comprises the SEM image.

Further, in some implementations, multiple images can be used to determine any of the errors described herein. For example, the determining, based on the image obtained based on the scan of the substrate by the SEM, of the first error can include determining, based on images obtained based on the scan of the substrate by the SEM, the first error. Also, the determining, based on the image, of the second error associated with the real error of the structure can include determining, based on the images, the second error associated with the real error of the structure.

As previously discussed, some errors apparent in the SEM images are real physical errors in the printed structure. It may be those errors that are of primary interest when improving a lithography process. For example, the contact holes may not be perfectly circular and therefore their centers may not be exactly where intended due to errors in manufacturing or the limitations of operating at such a small scale. These are examples of "real errors" and are not the result of any imaging process. Accordingly, as used herein, a "real error" is a difference between a feature on the structure and a corresponding feature in a target pattern. As used herein, "features" can include, for example, an edge placement gauge (a coordinate of the feature which may, for example, specify edge placement of the different sides of the contact hole such as left, right, top or bottom), a contact hole center, a critical dimension, the color of the contact hole in the SEM image (e.g., measured in grey scale level), the ellipticity of the contact hole, etc.

Another type of error that can be present is an apparent error due to the imaging process. As used herein, such types of errors are collectively referred to as "SEM distortion(s)." SEM distortions can also be due to a variety of sources. For example, the SEM distortion can be due to one or more of an artifact in the electron imaging, vibrations in the SEM system, or artifacts in the electron detection. Electron imaging can include steps during microscopy where the SEM brings primary electrons from the electron gun to the substrate in a very small spot (which may be related to the pixel size), and secondary electrons back to the SEM detector (which can include an aperture and magnetic lenses). Artifacts in electron imaging can make the spot at the substrate larger, non-circular, not focused, different for different electron energies in the beam, displaced, etc., which can then result in an unexpected collection of secondary electrons, resulting in an SEM distortion. Electron detection can refer to what the detector does with the secondary electrons. Artifacts in electron detection can cause some part of the secondary electrons to not be detected, which can again result in the SEM distortion.

When analyzing SEM images to determine and/or reduce errors due to SEM distortions, implementations of the current subject matter can include decomposing a first error (due to the SEM distortion) into at least a time-constant error and a time-dependent error. Such decompositions can be valuable because the amount or characteristics of a particular type of error can indicate, for example, what adjustments to make to an SEM, what artifacts or other errors could be present, suggest specific changes to the operation of the SEM, etc. In this way, the error, (which again can be the product of real errors and SEM distortions) can be reduced by, for example, removing or reducing any of the time-constant error and the time-dependent error from the first error to reduce the error.

More formally, some implementations of the subject matter described herein can be used to determine the error shown in the SEM image by calculating a placement error $\vec{P}$, which can be a vector quantity between a calculated feature (e.g., a contact hole center as derived from the SEM image) and a corresponding expected feature of the target pattern (e.g., the center of the contact hole in the target pattern). While used herein as a vector quantity, in other implementations, the placement error can also be a scalar quantity. For example, X and Y displacements can be treated separately and expressed as scalars. The error associated with the scalar displacements can then be analyzed, alone or in combination, to derive estimates of anisotropy of the SEM and/or the placement error, similar to the methods described below based on the exemplary analysis of vector placement errors.

An example of the placement error is shown at the top of FIG. 4 by the expanded illustration of a contact hole center 330 and corresponding center 420 of the target pattern, with the placement error vector $\vec{P}$ 430 between them. In an embodiment, where instead of contact hole centers, edges of printed structures are being analyzed, the placement error can be a calculated edge placement error (EPE) that can be based on differences in edge coordinates between those measured from the SEM image and those in the target pattern. Accordingly, in some implementations, the real error can be determined based a difference between the contour and a corresponding feature in target pattern 340.

In an implementation, the procedure can also include performing a decomposition of the variances of the placement error in structures such as contact holes or edge placement gauges, in which the variances can be a statistical quantification of the types of stochastic errors present in the SEM image and their magnitudes. For example, the variance of the placement error can be decomposed as follows:

$$\sigma^2(\vec{P}) = \sigma_{FOV,constant}^2 + \sigma_{FOV,time-dependent}^2 + \sigma_{wafer}^2. \quad (1)$$

In Eq. 1, $\sigma_{wafer}^2$ contains variations that are believed to be real variations in placement of structures on the substrate. For completeness, $\sigma_{wafer}^2$ also contains the SEM shot noise contribution, which is the measurement uncertainty due to shot noise of electrons in the SEM. The shot noise contribution quantity can be determined using repeated SEM measurements. However, this quantity can be small for CD measurements and therefore, in some cases, may be assumed not to be of interest. In contrast, in other cases, SEM shot noise effects on edge placement (or variations due to line-edge roughness) can be significant, and thus can optionally be included as part of $\sigma_{wafer}^2$.

Also, in Eq. 1, $\sigma_{FOV,constant}^2$ and $\sigma_{FOV,time-dependent}^2$ are the variances of the placement error due to distortions in the SEM. The first is the time-constant error that can be in a collection of SEM images, and the latter is the time-dependent error that can be different between SEM images acquired at different times.

It can be assumed that in some implementations artifacts in the SEM FOV can vary relatively smoothly over parts of the FOV (e.g., if the artifact is assumed to vary piecewise smoothly), while lithography-induced variations can vary on either a length scale much longer than the FOV (such as global CD fingerprints), or on a much shorter length scale, typically smaller or comparable to the CD (such as shot noise induced variations and mask variability). As discussed below, some short length scale features can average out over some portion of the SEM FOV.

In some implementations, the error can be determined in part by averaging some of local errors corresponding to T neighboring features (e.g., contact hole centers) in a field of view of the SEM. The placement errors due to variations on short length scale can average out, and hence reduce by a factor $\sqrt{T}$, while the variations on the long length scale (due to the SEM distortions) can be substantially constant in this group of T neighboring contact hole centers. In this way, the error can be separated into contributions due to the SEM distortion and the real error on the substrate.

In other implementations, the local errors can be weighted according to a weighted average of local errors centered at a center of the neighboring features. In yet other implementations, the local errors can be weighted according to a Gaussian distribution centered at a center of the neighboring features.

Figure 5A:
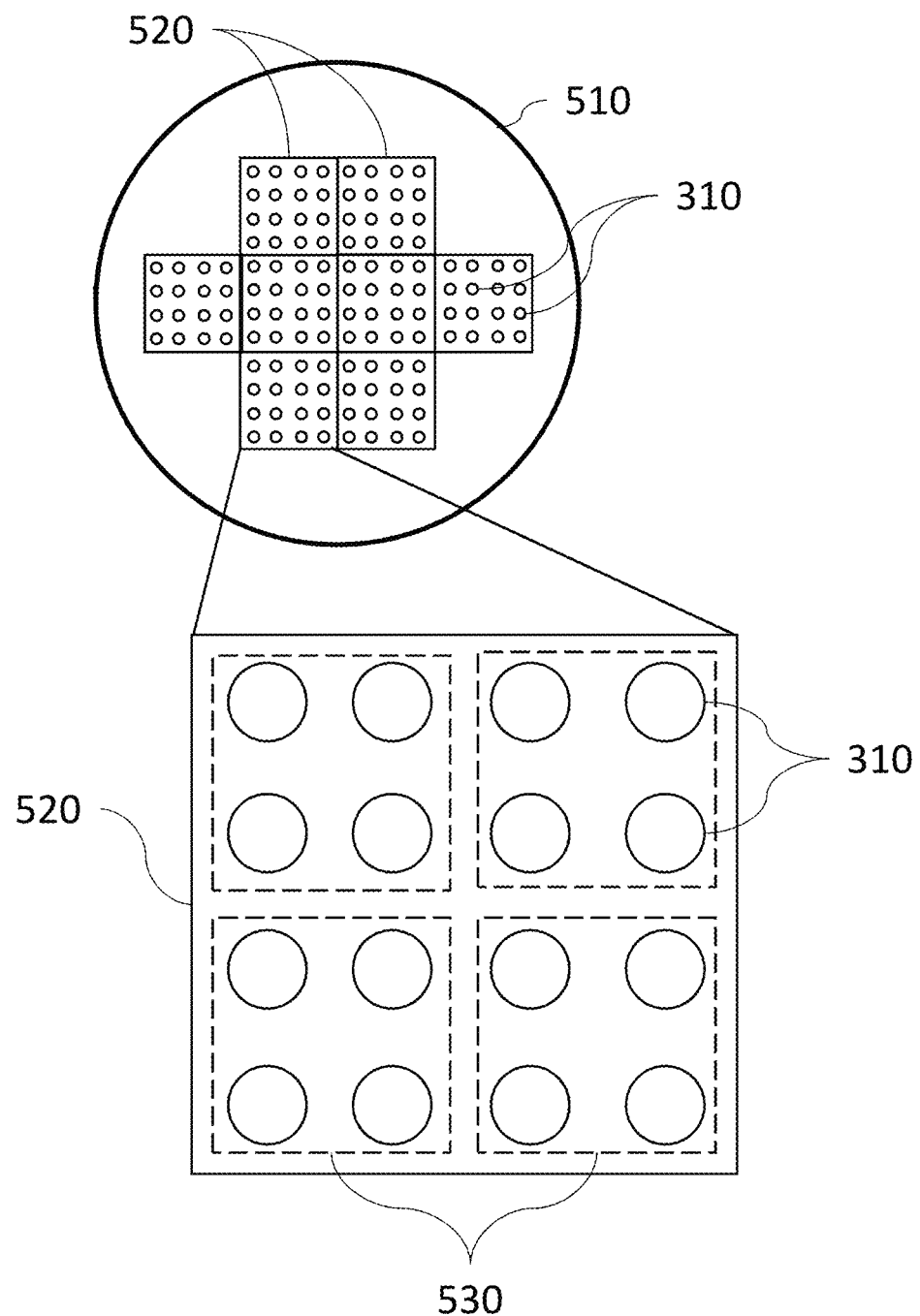
FIG. 5A schematically depicts the binning of contact holes on a substrate as used with an exemplary error determination process, according to an embodiment.

To further continue the simplified example, as shown in FIG. 5A, on the example substrate 510, there may be M images (M=8 in FIG. 5A) and N contact holes 310 (N=16 in FIG. 5A) in the FOV 520, so a total of N×M contact holes can be measured. The N contact holes can be split, in the FOV 520 as shown in the expanded view in the lower portion of the figure, into in R groups 530 (R=4 in FIG. 5A) of T (T=4 in FIG. 5A) contact holes. In various embodiments, the FOV can be split into boxes of, for example, 2×2, 4×4 or 8×8 contact holes. In other implementations, other sizes or dimensions of the boxes can be used, for example, rectangular boxes of 4×1, 6×1, 5×2, 3×1, 4×2, etc., with the larger number being in any dimension and the smaller number being in another dimension. The other direction may be orthogonal to the first dimension (e.g., a rectangle), but can also be in a non-orthogonal dimension (e.g., a skewed box or parallelogram-type of binning).

Continuing, the separate contributions to $\sigma^2(\vec{P})$ can be calculated. In obtaining the contributions to $\sigma^2(\vec{P})$, a sum of squares can be calculated as:

$$SS_{FOV,constant} = M \times T \times \sum_{i=1}^{R} \left( \frac{\sum_{j=1}^{M} \sum_{k=1}^{T} \vec{P}^{i,j,k}}{M \times T} - \frac{\sum_{i=1}^{R} \sum_{j=1}^{M} \sum_{k=1}^{T} \vec{P}^{i,j,k}}{R \times M \times T} \right)^2, \quad (2)$$

$$SS_{FOV,time-dependent} = T \times \sum_{i=1}^{R} \sum_{j=1}^{M} \left( \frac{\sum_{k=1}^{T} \vec{P}^{i,j,k}}{T} - \frac{\sum_{j=1}^{M} \sum_{k=1}^{T} \vec{P}^{i,j,k}}{M \times T} \right)^2, \quad (3)$$

and $$SS_{wafer} = \sum_{i=1}^{R} \sum_{j=1}^{M} \sum_{k=1}^{T} \left( \vec{P}^{i,j,k} - \frac{\sum_{k=1}^{T} \vec{P}^{i,j,k}}{T} \right)^2. \quad (4)$$

Furthermore, mean squares can be calculated as:

$$MS_{FOV,constant} = SS_{FOV,constant}/(R-1), \quad (5)$$

$$MS_{FOV,time-constant} = SS_{FOV,time-dependent}/R \times (M-1), \text{ and} \quad (6)$$

$$MS_{wafer} = SS_{wafer}/R \times M \times (T-1). \quad (7)$$

Finally, the contributions of the variances can follow from:

$$MS_{FOV,constant} = \sigma_{wafer}^2 + T \times \sigma_{FOV,time-dependent}^2 + M \times T \times \sigma_{FOV,constant}^2, \quad (8)$$

$$MS_{FOV,time-dependent} = \sigma_{wafer}^2 + T \times \sigma_{FOV,time-dependent}^2, \text{ and} \quad (9)$$

$$MS_{wafer} = \sigma_{wafer}^2. \quad (10)$$

In this way, when calculating the contributions of the types of errors present in SEM images, the first error or the second error can be mean square errors. Also, as seen from the above, the variability of the error can be expressed as a standard deviation of the error or a variance of the error.

In another embodiment, the averaging can optionally not be performed. This is equivalent to the special case where T=1, where the above equations are recast as shown below. In obtaining the contributions to $\sigma^2(\vec{P})$, a sum of squares can be calculated as:

$$SS_{FOV,constant} = M \times \sum_{i=1}^{R} \left( \frac{\sum_{j=1}^{M} \vec{P}^{i,j}}{M} - \frac{\sum_{i=1}^{R} \sum_{j=1}^{M} \vec{P}^{i,j}}{R \times M} \right)^2, \quad (11)$$

$$SS_{FOV,timedependent\&wafer} = \sum_{i=1}^{R} \sum_{j=1}^{M} \left( \vec{P}^{i,j} - \frac{\sum_{j=1}^{M} \vec{P}^{i,j}}{M} \right)^2. \quad (12)$$

Furthermore, mean squares can be calculated as:

$$MS_{FOV,constant} = SS_{FOV,constant}/(R-1), \quad (13)$$

$$MS_{FOV,timedependent\&wafer} = \frac{SS_{FOV,timedependent\&wafer}}{R \times (M-1)}, \text{ and} \quad (14)$$

Finally, the contributions of the variances can follow from:

$$MS_{FOV,constant} = \sigma_{FOV,timedependent\ \&\ wafer}^2 + M \times \sigma_{FOV,constant}^2, \quad (15)$$

$$MS_{FOV,timedependent\ \&\ wafer} = \sigma_{FOV,timedependent\ \&\ wafer}^2. \quad (16)$$

Figure 5B:
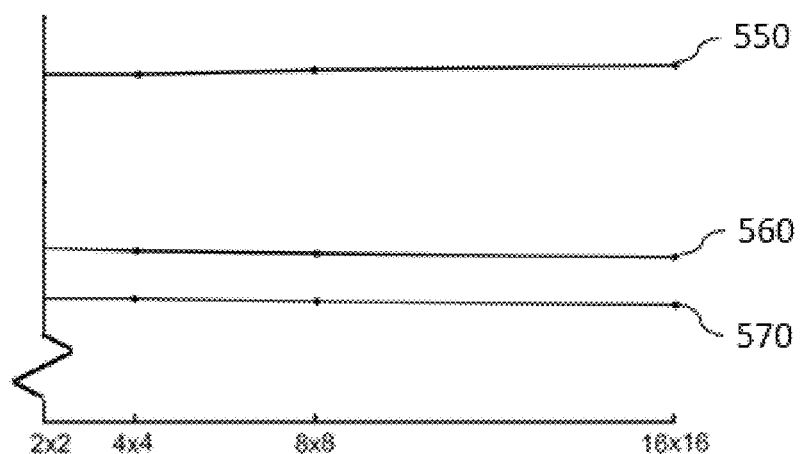
FIG. 5B schematically depicts exemplary results of decomposing an error measured with from an SEM image, according to an embodiment.

Shown in FIG. 5B, is the result of the above example procedure, performed with a dataset of several million contact holes that were measured on a large FOV SEM metrology device. The plot in FIG. 5B illustrates different components of the decomposition for an increasing number of holes per group. Specifically, curves are shown for real error 550, time-constant error 560, and SEM distortion per image 570. Furthermore, it is shown that the results are stable, even at such comparatively small values of T.

In other embodiments, the error that was decomposed as described by calculating the residual displacement can allow identification of sources of error in a lithography system and provide a basis for automatically improving a lithography process. This can be done by calculating residual displacements determined from SEM images. In some embodiments, a real residual displacement can be generated by, for example, removing the first error associated with the SEM distortion. For example, for any of the contact holes (e.g., each of the N×M contact holes), the real residual displacement due to real substrate displacements (and SEM shot noise, again assumed small) can be calculated as:

$$\delta \vec{P}_{wafer}^{i,j,k} = \vec{P}^{i,j,k} - \frac{\sum_{k=1}^{T} \vec{P}^{i,j,k}}{T}. \quad (17)$$

Figure 6:
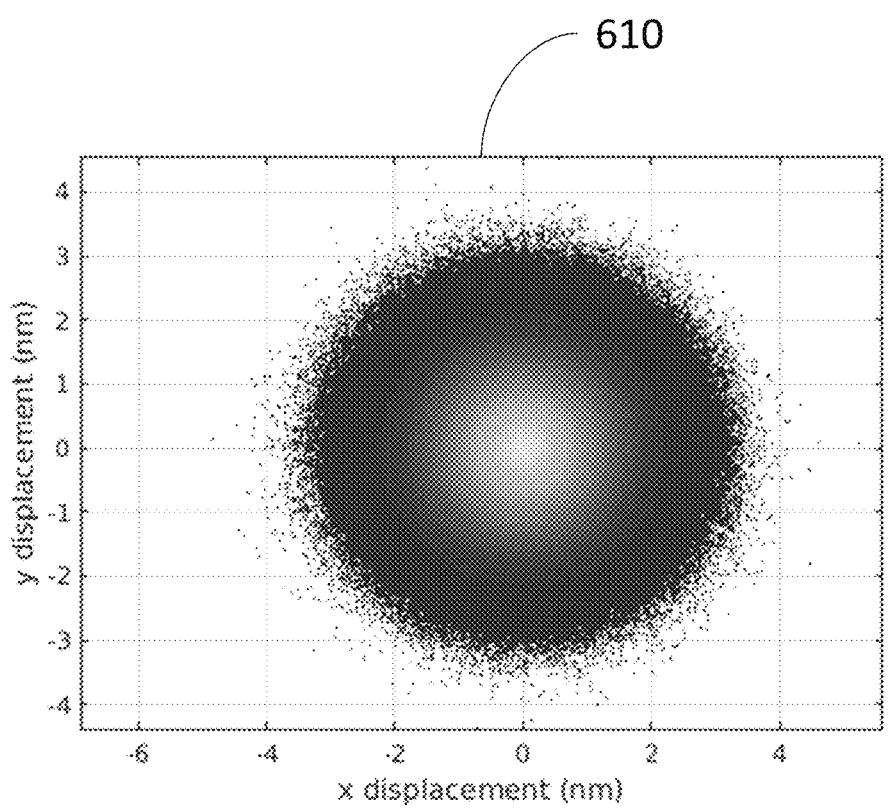
FIG. 6 schematically depicts an exemplary histogram of residual contact hole displacements, according to an embodiment.

This real residual displacement can be further analyzed by calculating, for example, directional dependencies, higher moments, or generating a histogram of it. An example of a histogram 610 of the above described dataset of several million points is shown in FIG. 6. The histogram may be analyzed, for example, to calculate distributions along one or more axes, which may identify local errors due to random, stochastic effects, but may also identify a systematic error in the structures on the substrate caused by a particular part of the lithography process. For example, this histogram can be analyzed in different directions to determine whether the displacement is according to a Gaussian distribution. If not, and there are more outliers than expected, failure rate predictions that may have been based on $\sigma_{wafer}$ would not hold anymore.

It may be expected that for a very accurate process, that a three-dimensional histogram as shown in FIG. 6 would be localized near the axis and be quite symmetrical. However, if it is determined that the histogram contains an asymmetry (e.g., exceeding some threshold condition) then features corresponding to those data points in the histogram can be flagged. Based on the real residual displacement, one or more features of the structure (e.g., contact hole centers) can be flagged when a portion of the residual distortion associated with the feature exceeds a threshold.

In some implementations, the frequency of incorrectly placed features can be used as a measure of quality of the lithography process. If the histogram deviates from an expected value or shape, then the process can be flagged as "error prone." (in the example of the boundary point histogram: more outward excursions than in a Gaussian distribution can suggest a process that has merging contact holes). Accordingly, the process should then be adjusted or optimized. In some implementations, one threshold can be requiring that the skewness is above or below a certain value, or not more than a given fraction of contact holes (e.g., 0.1%, 0.01%, 0.001%, 0.0001%, etc.) are located more than 3 or 6 standard deviations from 0. Another example of a threshold can be an absolute distance (e.g., 10 nm, 3 nm, 1 nm, etc.). Accordingly, the "failure rate" (based on the above thresholds) is then however strongly linked to the standard deviation of the placement (width of the distribution). A further example of a threshold can be a relative distance (e.g. more than 3 or 6 standard deviations). The "failure rate" is then the above-mentioned metric for the "non-Gaussian"-ness of the distribution.

Moreover, we can determine for the contact holes (e.g., for each of the R groups of contact holes in the FOV) the mean time-constant and mean time-dependent residual displacements associated with the SEM distortion:

$$\delta \overline{P}^i_{FOV,constant} = \frac{\sum_{j=1}^{M}\sum_{k=1}^{T} \overline{p}^{i,j,k}}{M \times T} - \frac{\sum_{i=1}^{R}\sum_{j=1}^{M}\sum_{k=1}^{T} \overline{p}^{i,j,k}}{R \times M \times T} \quad (18)$$

and $$\delta \overline{P}^{i,j}_{FOV,time-dependent} = \frac{\sum_{k=1}^{T} \overline{p}^{i,j,k}}{T} - \frac{\sum_{j=1}^{M}\sum_{k=1}^{T} \overline{p}^{i,j,k}}{M \times T}. \quad (19)$$

Figure 7:
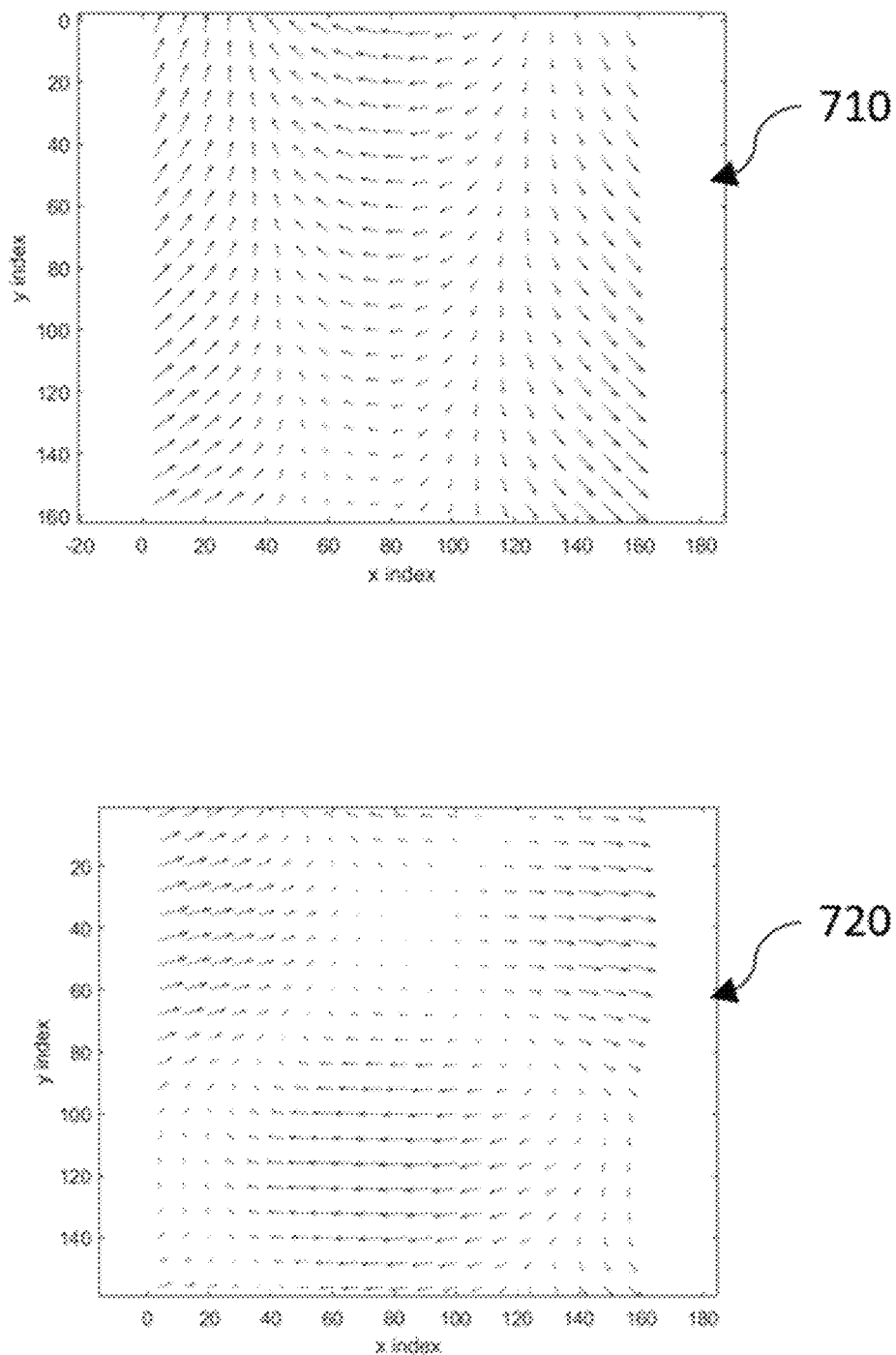
FIG. 7 schematically depicts an exemplary vector fields representing a decomposed SEM distortion, according to an embodiment.

FIG. 7 is a plot of synthetic data illustrating a time-constant residual 710 and a time-dependent residual 720 in the form of vector fields. These example vector fields can be generated by binning and averaging a number of displacements in some or all of the synthetically generated SEM FOV (T=8×8=64 in FIG. 7). Such vector fields can thereby be used to calculate a "fingerprint" (or substantially unique characteristic) of the SEM FOV. Such vector fields can also be used to monitor or improve the operation of SEM, or the lithography process as a whole, as described herein.

Figure 8:
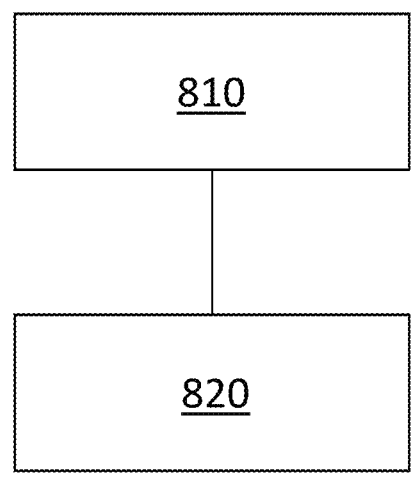
FIG. 8 schematically is a block diagram of an exemplary process, according to an embodiment.

Implementations of the error determination as described herein can be used to improve the lithography process or the SEM imaging. As illustrated in FIG. 8, one example of method of reducing variability of an error associated with a structure on a substrate in a lithography process can include, at 810, determining, based at least on an image obtained based on a scan of the substrate by a scanning electron microscope (SEM), a first error due to a SEM distortion in the image.

At 820, at least one data processor can generate a command that enables a modification of the lithography process and an associated reduction of the variability of the error based on reducing the first error.

More generally, other implementations of the disclosed subject matter can include, after determining the first error or the second error, generating, by a data processor, a command that enables a modification of the lithography process and an associated reduction of the variability of the error based on reducing any of the first error or the second error. In some embodiments, modifying of the lithography process can include, for example, changing a focus of a light source used to manufacture a substrate, modifying one or more parameters used in a source-mask optimization, modifying a number of light sources used in the lithography process, and modifying a configuration of mirrors on a digital mirror device.

Specific examples of how the lithography process can be improved can include optimizing the pupil ("light source") or mask to minimize $\sigma_{wafer}$. Another implementation can include generating a substrate fingerprint with the patterns in the fingerprint corresponding to problems with, for example, the focus in the lithography scanner or some process-related problems. Accordingly, in some implementations, the focus of a lithography scanner can be automatically adjusted based on the first error or the second error to reduce the variability of the error in the images acquired by the SEM.

Also, in some embodiments, the apparent error calculated based on the images can be corrected by changing the operation of the SEM. In particular, embodiments can include monitoring, by at least one data processor, images acquired by the SEM and determining whether the error exceeds a threshold. When the threshold is exceeded, any of the following can be generated: an alert to a user to recalibrate the SEM, a command causing the SEM to automatically recalibrate, or an instruction that modifies the operation of the SEM to reduce the error.

In some implementations, substrate fingerprints in the rotation/scaling of the distortion profile per picture can be analyzed to reveal problems in the SEM substrate stage. Such analysis of the SEM distortion can be implemented by software to automatically refine the positioning grid calibration of the SEM. In other implementations, frequency analysis of distortion profiles in different pictures can reveal resonances in the SEM. Such resonances can be characterized by distortion profiles being predominantly varying in one direction (e.g., the y-direction). In yet other implementations, aberrations of the magnetic lenses in the SEM can be related to specific shapes in the distortion fingerprint. When the method is applied to fingerprints of image-quality parameters (e.g. sharpness of the boundaries), this can also reveal the effects of lens aberrations (or possibly other types of aberrations), which effects may be reduced for by adjusting the operational parameters (e.g., beam energy, focus, scan speed, etc.) of the SEM, in this way the variability of the error can be reduced. The method can thus be used to qualify the SEM, to monitor drift in the aberration of the SEM, and for root-cause analysis for problems where aberrations are expected to play a role.

A lithographic projection apparatus can be used, for example, in the manufacture of integrated circuits (ICs). In such a case, a patterning device (e.g., a mask) may contain or provide a pattern corresponding to an individual layer of the IC ("design layout"), and this pattern can be transferred onto a target portion (e.g. comprising one or more dies) on a substrate (e.g., silicon wafer) that has been coated with a layer of radiation-sensitive material ("resist"), by methods such as irradiating the target portion through the pattern on the patterning device. In general, a single substrate contains a plurality of adjacent target portions to which the pattern is transferred successively by the lithographic projection apparatus, one target portion at a time. In one type of lithographic projection apparatuses, the pattern on the entire patterning device is transferred onto one target portion in one go; such an apparatus may also be referred to as a stepper. In an alternative apparatus, a step-and-scan apparatus can cause a projection beam to scan over the patterning device in a given reference direction (the "scanning" direction) while synchronously moving the substrate parallel or anti-parallel to this reference direction. Different portions of the pattern on the patterning device are transferred to one target portion progressively. Since, in general, the lithographic projection apparatus will have a reduction ratio M (e.g., 4), the speed F at which the substrate is moved will be 1/M times that at which the projection beam scans the patterning device. More information with regard to lithographic devices can be found in, for example, U.S. Pat. No. 6,046,792, incorporated herein by reference.

Prior to transferring the pattern from the patterning device to the substrate, the substrate may undergo various procedures, such as priming, resist coating and a soft bake. After exposure, the substrate may be subjected to other procedures ("post-exposure procedures"), such as a post-exposure bake (PEB), development, a hard bake and measurement/inspection of the transferred pattern. This array of procedures is used as a basis to make an individual layer of a device, e.g., an IC. The substrate may then undergo various processes such as etching, ion-implantation (doping), metallization, oxidation, chemo-mechanical polishing, etc., all intended to finish off the individual layer of the device. If several layers are required in the device, then the whole procedure, or a variant thereof, is repeated for each layer. Eventually, a device will be present in each target portion on the substrate. These devices are then separated from one another by a technique such as dicing or sawing, whence the individual devices can be mounted on a carrier, connected to pins, etc.

As noted, lithography is a central step in the manufacturing of device such as ICs, where patterns formed on substrates define functional elements of the devices, such as microprocessors, memory chips, etc. Similar lithographic techniques are also used in the formation of flat panel displays, micro-electro mechanical systems (MEMS) and other devices.

As semiconductor manufacturing processes continue to advance, the dimensions of functional elements have continually been reduced while the amount of functional elements, such as transistors, per device has been steadily increasing over decades, following a trend referred to as "Moore's law." At the current state of technology, layers of devices are manufactured using lithographic projection apparatuses that project a design layout onto a substrate using illumination from a deep-ultraviolet illumination source, creating individual functional elements having dimensions well below 100 nm, i.e. less than half the wavelength of the radiation from the illumination source (e.g., a 193 nm illumination source).

This process in which features with dimensions smaller than the classical resolution limit of a lithographic projection apparatus are printed, is can be referred to as low-k1 lithography, according to the resolution formula $CD=k1 \times \lambda / NA$, where $\lambda$ is the wavelength of radiation employed (e.g., 248 nm or 193 nm), NA is the numerical aperture of projection optics in the lithographic projection apparatus, CD is the "critical dimension"—generally the smallest feature size printed—and k1 is an empirical resolution factor. In general, the smaller k1 the more difficult it becomes to reproduce a pattern on the substrate that resembles the shape and dimensions planned by a designer in order to achieve particular electrical functionality and performance. To overcome these difficulties, sophisticated fine-tuning steps are applied to the lithographic projection apparatus, the design layout, or the patterning device. These include, for example, but not limited to, optimization of NA and optical coherence settings, customized illumination schemes, use of phase shifting patterning devices, optical proximity correction (OPC, sometimes also referred to as "optical and process correction") in the design layout, or other methods generally defined as "resolution enhancement techniques" (RET). The term "projection optics" as used herein should be broadly interpreted as encompassing various types of optical systems, including refractive optics, reflective optics, apertures and catadioptric optics, for example. The term "projection optics" may also include components operating according to any of these design types for directing, shaping or controlling the projection beam of radiation, collectively or singularly. The term "projection optics" may include any optical component in the lithographic projection apparatus, no matter where the optical component is located on an optical path of the lithographic projection apparatus. Projection optics may include optical components for shaping, adjusting and/or projecting radiation from the source before the radiation passes the patterning device, and/or optical components for shaping, adjusting and/or projecting the radiation after the radiation passes the patterning device. The projection optics generally exclude the source and the patterning device.

Although specific reference may be made in this text to the manufacture of ICs, it should be explicitly understood that the description herein has many other possible applications. For example, it may be employed in the manufacture of integrated optical systems, guidance and detection patterns for magnetic domain memories, liquid-crystal display panels, thin-film magnetic heads, etc. The skilled artisan will appreciate that, in the context of such alternative applications, any use of the terms "reticle", "wafer" or "die" in this text should be considered as interchangeable with the more general terms "mask", "substrate" and "target portion", respectively.

In the present document, the terms "radiation" and "beam" are used to encompass all types of electromagnetic radiation, including ultraviolet radiation (e.g. with a wavelength of 365, 248, 193, 157 or 126 nm) and EUV (extreme ultra-violet radiation, e.g. having a wavelength in the range of about 5-100 nm).

The patterning device can comprise, or can form, one or more design layouts. The design layout can be generated utilizing CAD (computer-aided design) programs, this process often being referred to as EDA (electronic design automation). Most CAD programs follow a set of predetermined design rules in order to create functional design layouts/patterning devices. These rules are set by processing and design limitations. For example, design rules define the space tolerance between devices (such as gates, capacitors, etc.) or interconnect lines, so as to ensure that the devices or lines do not interact with one another in an undesirable way. One or more of the design rule limitations may be referred to as "critical dimension" (CD). A critical dimension of a device can be defined as the smallest width of a line or hole or the smallest space between two lines or two holes. Thus, the CD determines the overall size and density of the designed device. Of course, one of the goals in device fabrication is to faithfully reproduce the original design intent on the substrate (via the patterning device).

The term "mask" or "patterning device" as employed in this text may be broadly interpreted as referring to a generic patterning device that can be used to endow an incoming radiation beam with a patterned cross-section, corresponding to a pattern that is to be created in a target portion of the substrate; the term "light valve" can also be used in this context. Besides the classic mask (transmissive or reflective; binary, phase-shifting, hybrid, etc.), examples of other such patterning devices include a programmable mirror array and a programmable LCD array.

An example of a programmable mirror array can be a matrix-addressable surface having a viscoelastic control layer and a reflective surface. The basic principle behind such an apparatus is that (for example) addressed areas of the reflective surface reflect incident radiation as diffracted radiation, whereas unaddressed areas reflect incident radiation as undiffracted radiation. Using an appropriate filter, the said undiffracted radiation can be filtered out of the reflected beam, leaving only the diffracted radiation behind; in this manner, the beam becomes patterned according to the addressing pattern of the matrix-addressable surface. The required matrix addressing can be performed using suitable electronic methods.

An example of a programmable LCD array is given in U.S. Pat. No. 5,229,872, which is incorporated herein by reference.

Figure 9:
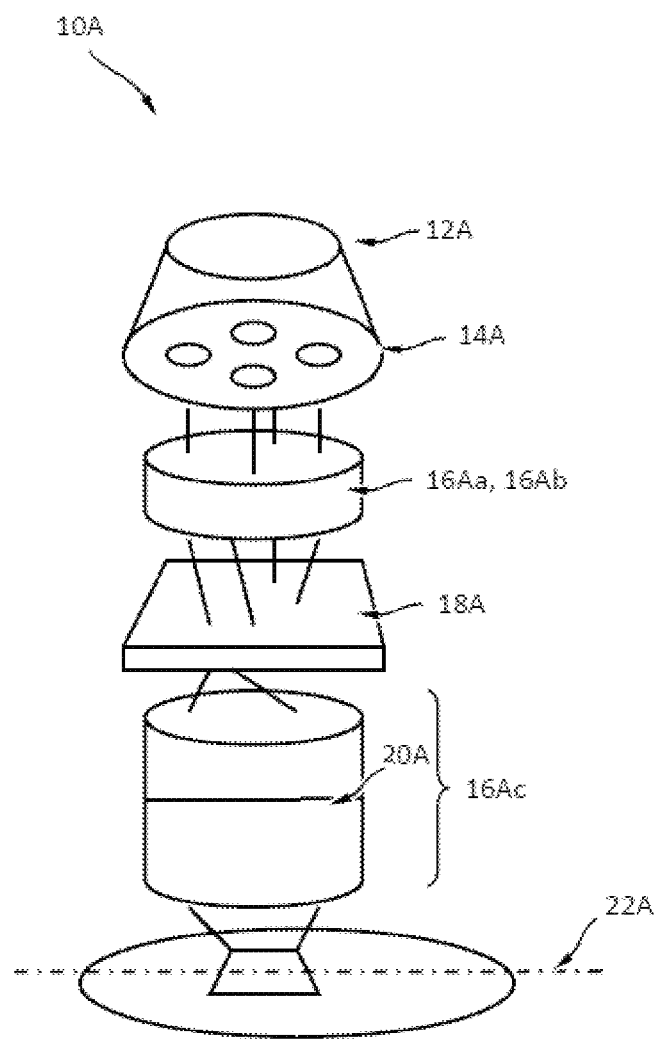
FIG. 9 illustrates a block diagram of various subsystems of a lithographic projection apparatus, according to an embodiment.

FIG. 9 illustrates a block diagram of various subsystems of a lithographic projection apparatus 10A, according to an embodiment. Major components are a radiation source 12A, which may be a deep-ultraviolet excimer laser source or other type of source including an extreme ultra violet (EUV) source (as discussed above, the lithographic projection apparatus itself need not have the radiation source), illumination optics which, e.g., define the partial coherence (denoted as sigma) and which may include optics 14A, 16Aa and 16Ab that shape radiation from the source 12A; a patterning device 18A; and transmission optics 16Ac that project an image of the patterning device pattern onto a substrate plane 22A. An adjustable filter or aperture 20A at the pupil plane of the projection optics may restrict the range of beam angles that impinge on the substrate plane 22A, where the largest possible angle defines the numerical aperture of the projection optics $NA=n \sin(\Theta_{max})$, wherein n is the refractive index of the media between the substrate and the last element of the projection optics, and $\Theta_{max}$ is the largest angle of the beam exiting from the projection optics that can still impinge on the substrate plane 22A.

In a lithographic projection apparatus, a source provides illumination (i.e. radiation) to a patterning device and projection optics direct and shape the illumination, via the patterning device, onto a substrate. The projection optics may include at least some of the components 14A, 16Aa, 16Ab and 16Ac. An aerial image (AI) is the radiation intensity distribution at substrate level. A resist model can be used to calculate the resist image from the aerial image, an example of which can be found in U.S. Patent Application Publication No. US 2009-0157360, the disclosure of which is hereby incorporated by reference in its entirety. The resist model is related only to properties of the resist layer (e.g., effects of chemical processes which occur during exposure, post-exposure bake (PEB) and development). Optical properties of the lithographic projection apparatus (e.g., properties of the illumination, the patterning device and the projection optics) dictate the aerial image and can be defined in an optical model. Since the patterning device used in the lithographic projection apparatus can be changed, it is desirable to separate the optical properties of the patterning device from the optical properties of the rest of the lithographic projection apparatus including at least the source and the projection optics. Details of techniques and models used to transform a design layout into various lithographic images (e.g., an aerial image, a resist image, etc.), apply OPC using those techniques and models and evaluate performance (e.g., in terms of process window) are described in U.S. Patent Application Publication Nos. US 2008-0301620, 2007-0050749, 2007-0031745, 2008-0309897, 2010-0162197, and 2010-0180251, the disclosure of each which is hereby incorporated by reference in its entirety.

One aspect of understanding a lithographic process is understanding the interaction of the radiation and the patterning device. The electromagnetic field of the radiation after the radiation passes the patterning device may be determined from the electromagnetic field of the radiation before the radiation reaches the patterning device and a function that characterizes the interaction. This function may be referred to as the mask transmission function (which can be used to describe the interaction by a transmissive patterning device and/or a reflective patterning device).

The mask transmission function may have a variety of different forms. One form is binary. A binary mask transmission function has either of two values (e.g., zero and a positive constant) at any given location on the patterning device. A mask transmission function in the binary form may be referred to as a binary mask. Another form is continuous. Namely, the modulus of the transmittance (or reflectance) of the patterning device is a continuous function of the location on the patterning device. The phase of the transmittance (or reflectance) may also be a continuous function of the location on the patterning device. A mask transmission function in the continuous form may be referred to as a continuous tone mask or a continuous transmission mask (CTM). For example, the CTM may be represented as a pixelated image, where each pixel may be assigned a value between 0 and 1 (e.g., 0.1, 0.2, 0.3, etc.) instead of binary value of either 0 or 1. In an embodiment, CTM may be a pixelated gray scale image, where each pixel having values (e.g., within a range [−255, 255], normalized values within a range [0, 1] or [−1, 1] or other appropriate ranges).

The thin-mask approximation, also called the Kirchhoff boundary condition, is widely used to simplify the determination of the interaction of the radiation and the patterning device. The thin-mask approximation assumes that the thickness of the structures on the patterning device is very small compared with the wavelength and that the widths of the structures on the mask are very large compared with the wavelength. Therefore, the thin-mask approximation assumes the electromagnetic field after the patterning device is the multiplication of the incident electromagnetic field with the mask transmission function. However, as lithographic processes use radiation of shorter and shorter wavelengths, and the structures on the patterning device become smaller and smaller, the assumption of the thin-mask approximation can break down. For example, interaction of the radiation with the structures (e.g., edges between the top surface and a sidewall) because of their finite thicknesses ("mask 3D effect" or "M3D") may become significant. Encompassing this scattering in the mask transmission function may enable the mask transmission function to better capture the interaction of the radiation with the patterning device. A mask transmission function under the thin-mask approximation may be referred to as a thin-mask transmission function. A mask transmission function encompassing M3D may be referred to as a M3D mask transmission function.

According to an embodiment of the present disclosure, one or more images may be generated. The images include various types of signals that may be characterized by pixel values or intensity values of each pixel. Depending on the relative values of the pixel within the image, the signal may be referred as, for example, a weak signal or a strong signal, as may be understood by a person of ordinary skill in the art. The term "strong" and "weak" are relative terms based on intensity values of pixels within an image and specific values of intensity may not limit scope of the present disclosure. In an embodiment, the strong and weak signal may be identified based on a selected threshold value. In an embodiment, the threshold value may be fixed (e.g., a midpoint of a highest intensity and a lowest intensity of pixel within the image. In an embodiment, a strong signal may refer to a signal with values greater than or equal to an average signal value across the image and a weak signal may refer to signal with values less than the average signal value. In an embodiment, the relative intensity value may be based on percentage. For example, the weak signal may be signal having intensity less than 50% of the highest intensity of the pixel (e.g., pixels corresponding to target pattern may be considered pixels with highest intensity) within the image. Furthermore, each pixel within an image may considered as a variable. According to the present embodiment, derivatives or partial derivative may be determined with respect to each pixel within the image and the values of each pixel may be determined or modified according to a cost function based evaluation and/or gradient based computation of the cost function. For example, a CTM image may include pixels, where each pixel is a variable that can take any real value.

Figure 10:
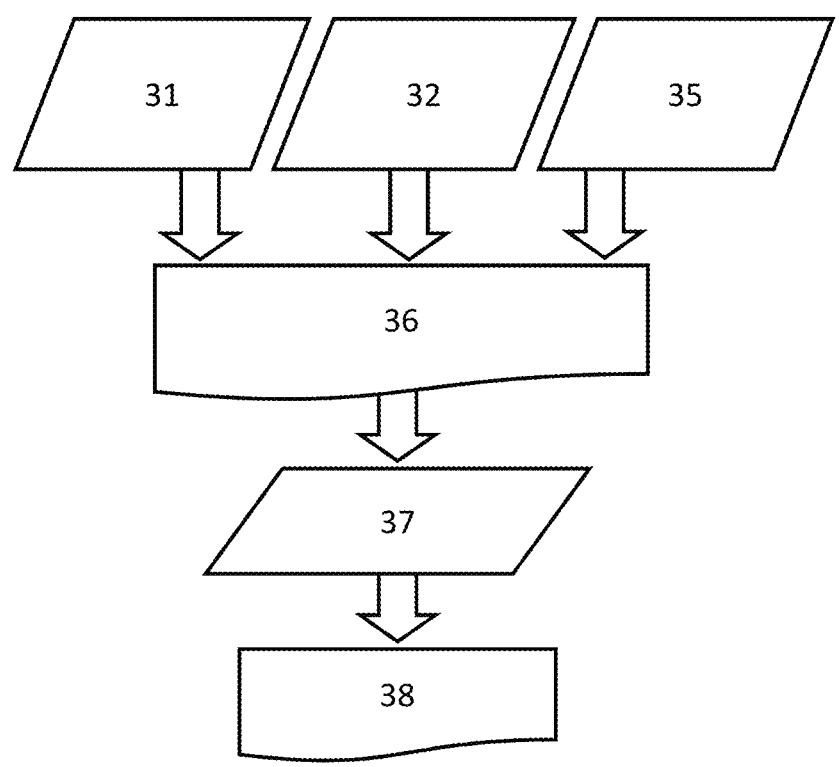
FIG. 10 illustrates an exemplary flow chart for simulating lithography in a lithographic projection apparatus, according to an embodiment.

FIG. 10 illustrates an exemplary flow chart for simulating lithography in a lithographic projection apparatus, according to an embodiment. Source model 31 represents optical characteristics (including radiation intensity distribution and/or phase distribution) of the source. Projection optics model 32 represents optical characteristics (including changes to the radiation intensity distribution and/or the phase distribution caused by the projection optics) of the projection optics. Design layout model 35 represents optical characteristics of a design layout (including changes to the radiation intensity distribution and/or the phase distribution caused by design layout 33), which is the representation of an arrangement of features on or formed by a patterning device. Aerial image 36 can be simulated from design layout model 35, projection optics model 32, and design layout model 35. Resist image 38 can be simulated from aerial image 36 using resist model 37. Simulation of lithography can, for example, predict contours and CDs in the resist image.

More specifically, it is noted that source model 31 can represent the optical characteristics of the source that include, but not limited to, numerical aperture settings, illumination sigma (σ) settings as well as any particular illumination shape (e.g. off-axis radiation sources such as annular, quadrupole, dipole, etc.). Projection optics model 32 can represent the optical characteristics of the projection optics, including aberration, distortion, one or more refractive indexes, one or more physical sizes, one or more physical dimensions, etc. Design layout model 35 can represent one or more physical properties of a physical patterning device, as described, for example, in U.S. Pat. No. 7,587,704, which is incorporated by reference in its entirety. The objective of the simulation is to accurately predict, for example, edge placement, aerial image intensity slope and/or CD, which can then be compared against an intended design. The intended design is generally defined as a pre-OPC design layout which can be provided in a standardized digital file format such as GDS II or OASIS or other file format.

From this design layout, one or more portions may be identified, which are referred to as "clips". In an embodiment, a set of clips is extracted, which represents the complicated patterns in the design layout (typically about 50 to 1000 clips, although any number of clips may be used). These patterns or clips represent small portions (i.e. circuits, cells or patterns) of the design and more specifically, the clips typically represent small portions for which particular attention and/or verification is needed. In other words, clips may be the portions of the design layout, or may be similar or have a similar behavior of portions of the design layout, where one or more critical features are identified either by experience (including clips provided by a customer), by trial and error, or by running a full-chip simulation. Clips may contain one or more test patterns or gauge patterns.

An initial larger set of clips may be provided a priori by a customer based on one or more known critical feature areas in a design layout which require particular image optimization. Alternatively, in another embodiment, an initial larger set of clips may be extracted from the entire design layout by using some kind of automated (such as machine vision) or manual algorithm that identifies the one or more critical feature areas.

In a lithographic projection apparatus, as an example, a cost function may be expressed as $$CF(z_1,z_2,\ldots,z_N) = \sum_{p=1}^{P} w_p f_p^2(z_1,z_2,\ldots,z_N) \quad (20)$$

where $(z_1,z_2,\ldots,z_N)$ are N design variables or values thereof. $f_p(z_1,z_2,\ldots,z_N)$ can be a function of the design variables $(z_1,z_2,\ldots,z_N)$ such as a difference between an actual value and an intended value of a characteristic for a set of values of the design variables of $(z_1,z_2,\ldots,z_N)$. $w_p$ is a weight constant associated with $f_p(z_1,z_2,\ldots,z_N)$. For example, the characteristic may be a position of an edge of a pattern, measured at a given point on the edge. Different $f_p(z_1,z_2,\ldots,z_N)$ may have different weight $w_p$. For example, if a particular edge has a narrow range of permitted positions, the weight $w_p$ for the $f_p(z_1,z_2,\ldots,z_N)$ representing the difference between the actual position and the intended position of the edge may be given a higher value. $f_p(z_1,z_2,\ldots,z_N)$ can also be a function of an interlayer characteristic, which is in turn a function of the design variables $(z_1,z_2,\ldots,z_N)$. Of course, $CF(z_1,z_2,\ldots,z_N)$ is not limited to the form in Eq. 20. $CF(z_1,z_2,\ldots,z_N)$ can be in any other suitable form.

The cost function may represent any one or more suitable characteristics of the lithographic projection apparatus, lithographic process or the substrate, for instance, focus, CD, image shift, image distortion, image rotation, stochastic variation, throughput, local CD variation, process window, an interlayer characteristic, or a combination thereof. In one embodiment, the design variables $(z_1,z_2,\ldots,z_N)$ comprise one or more selected from dose, global bias of the patterning device, and/or shape of illumination. Since it is the resist image that often dictates the pattern on a substrate, the cost function may include a function that represents one or more characteristics of the resist image. For example, $f_p(z_1,z_2,\ldots,z_N)$ can be simply a distance between a point in the resist image to an intended position of that point (i.e., edge placement error $EPE_p(z_1,z_2,\ldots,z_N)$). The design variables can include any adjustable parameter such as an adjustable parameter of the source, the patterning device, the projection optics, dose, focus, etc.

The lithographic apparatus may include components collectively called a "wavefront manipulator" that can be used to adjust the shape of a wavefront and intensity distribution and/or phase shift of a radiation beam. In an embodiment, the lithographic apparatus can adjust a wavefront and intensity distribution at any location along an optical path of the lithographic projection apparatus, such as before the patterning device, near a pupil plane, near an image plane, and/or near a focal plane. The wavefront manipulator can be used to correct or compensate for certain distortions of the wavefront and intensity distribution and/or phase shift caused by, for example, the source, the patterning device, temperature variation in the lithographic projection apparatus, thermal expansion of components of the lithographic projection apparatus, etc. Adjusting the wavefront and intensity distribution and/or phase shift can change values of the characteristics represented by the cost function. Such changes can be simulated from a model or actually measured. The design variables can include parameters of the wavefront manipulator.

The design variables may have constraints, which can be expressed as $(z_1,z_2,\ldots,z_N) \in Z$, where Z is a set of possible values of the design variables. One possible constraint on the design variables may be imposed by a desired throughput of the lithographic projection apparatus. Without such a constraint imposed by the desired throughput, the optimization may yield a set of values of the design variables that are unrealistic. For example, if the dose is a design variable, without such a constraint, the optimization may yield a dose value that makes the throughput economically impossible. However, the usefulness of constraints should not be interpreted as a necessity. For example, the throughput may be affected by the pupil fill ratio. For some illumination designs, a low pupil fill ratio may discard radiation, leading to lower throughput. Throughput may also be affected by the resist chemistry. Slower resist (e.g., a resist that requires higher amount of radiation to be properly exposed) leads to lower throughput.

As used herein, the term "patterning process" means a process that creates an etched substrate by the application of specified patterns of light as part of a lithography process.

As used herein, the term "target pattern" means an idealized pattern that is to be etched on a substrate.

As used herein, the term "printed pattern" means the physical pattern on a substrate that was etched based on a target pattern. The printed pattern can include, for example, contact holes, troughs, channels, depressions, edges, or other two and three-dimensional features resulting from a lithography process.

As used herein, the term "imaging device" means any number or combination of devices and associated computer hardware and software that can be configured to generate images of a target, such as the printed pattern or portions thereof. Non-limiting examples of an imaging devices can include: scanning electron microscopes (SEMs), x-ray machines, metrology systems, etc.

As used herein, the term "process model" means a model that includes one or more models that simulate a patterning process. For example, a process model can include any combination of: an optical model (e.g., that models a lens system/projection system used to deliver light in a lithography process and may include modelling the final optical image of light that goes onto a photoresist), a resist model (e.g., that models physical effects of the resist, such as chemical effects due to the light), an OPC model (e.g., that can be used to make target patterns and may include sub-resolution resist features (SRAFs), etc.), an imaging device model (e.g., that models what an imaging device may image from a printed pattern).

As used herein, the term "calibrating" means to modify (e.g., improve or tune) and/or validate something, such as the process model.

Figure 11:
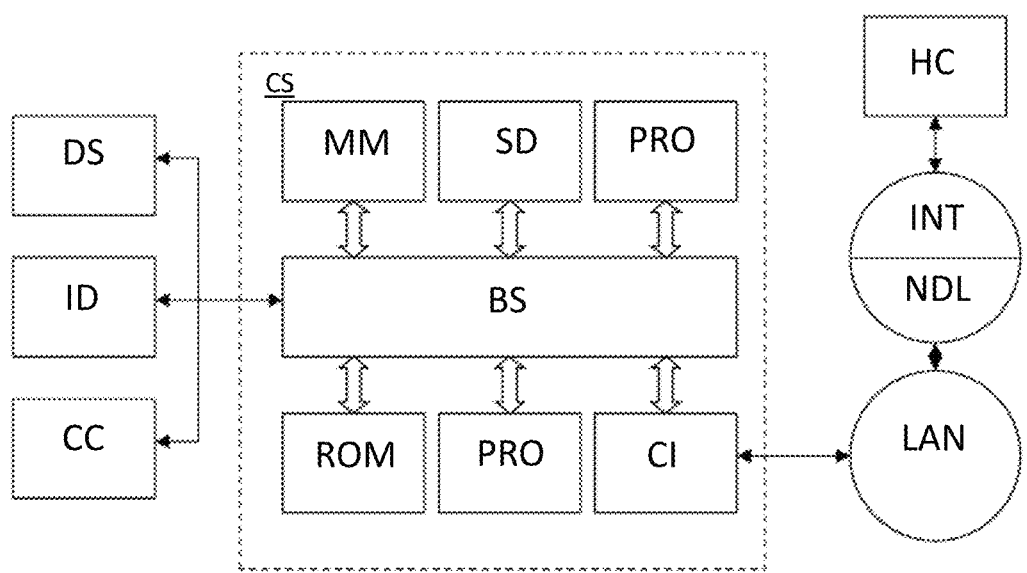
FIG. 11 is a block diagram of an example computer system, according to an embodiment.

FIG. 11 is a block diagram of an example computer system CS, according to an embodiment.

Computer system CS includes a bus BS or other communication mechanism for communicating information, and a processor PRO (or multiple processor) coupled with bus BS for processing information. Computer system CS also includes a main memory MM, such as a random access memory (RAM) or other dynamic storage device, coupled to bus BS for storing information and instructions to be executed by processor PRO. Main memory MM also may be used for storing temporary variables or other intermediate information during execution of instructions to be executed by processor PRO. Computer system CS further includes a read only memory (ROM) ROM or other static storage device coupled to bus BS for storing static information and instructions for processor PRO. A storage device SD, such as a magnetic disk or optical disk, is provided and coupled to bus BS for storing information and instructions.

Computer system CS may be coupled via bus BS to a display DS, such as a cathode ray tube (CRT) or flat panel or touch panel display for displaying information to a computer user. An input device ID, including alphanumeric and other keys, is coupled to bus BS for communicating information and command selections to processor PRO. Another type of user input device is cursor control CC, such as a mouse, a trackball, or cursor direction keys for communicating direction information and command selections to processor PRO and for controlling cursor movement on display DS. This input device typically has two degrees of freedom in two axes, a first axis (e.g., x) and a second axis (e.g., y), that allows the device to specify positions in a plane. A touch panel (screen) display may also be used as an input device.

According to one embodiment, portions of one or more methods described herein may be performed by computer system CS in response to processor PRO executing one or more sequences of one or more instructions contained in main memory MM. Such instructions may be read into main memory MM from another computer-readable medium, such as storage device SD. Execution of the sequences of instructions contained in main memory MM causes processor PRO to perform the process steps described herein. One or more processors in a multi-processing arrangement may also be employed to execute the sequences of instructions contained in main memory MM. In an alternative embodiment, hard-wired circuitry may be used in place of or in combination with software instructions. Thus, the description herein is not limited to any specific combination of hardware circuitry and software.

The term "computer-readable medium" as used herein refers to any medium that participates in providing instructions to processor PRO for execution. Such a medium may take many forms, including but not limited to, non-volatile media, volatile media, and transmission media. Non-volatile media include, for example, optical or magnetic disks, such as storage device SD. Volatile media include dynamic memory, such as main memory MM. Transmission media include coaxial cables, copper wire and fiber optics, including the wires that comprise bus BS. Transmission media can also take the form of acoustic or light waves, such as those generated during radio frequency (RF) and infrared (IR) data communications. Computer-readable media can be non-transitory, for example, a floppy disk, a flexible disk, hard disk, magnetic tape, any other magnetic medium, a CD-ROM, DVD, any other optical medium, punch cards, paper tape, any other physical medium with patterns of holes, a RAM, a PROM, and EPROM, a FLASH-EPROM, any other memory chip or cartridge. Non-transitory computer readable media can have instructions recorded thereon. The instructions, when executed by a computer, can implement any of the features described herein. Transitory computer-readable media can include a carrier wave or other propagating electromagnetic signal.

Various forms of computer readable media may be involved in carrying one or more sequences of one or more instructions to processor PRO for execution. For example, the instructions may initially be borne on a magnetic disk of a remote computer. The remote computer can load the instructions into its dynamic memory and send the instructions over a telephone line using a modem. A modem local to computer system CS can receive the data on the telephone line and use an infrared transmitter to convert the data to an infrared signal. An infrared detector coupled to bus BS can receive the data carried in the infrared signal and place the data on bus BS. Bus BS carries the data to main memory MM, from which processor PRO retrieves and executes the instructions. The instructions received by main memory MM may optionally be stored on storage device SD either before or after execution by processor PRO.

Computer system CS may also include a communication interface CI coupled to bus BS. Communication interface CI provides a two-way data communication coupling to a network link NDL that is connected to a local network LAN. For example, communication interface CI may be an integrated services digital network (ISDN) card or a modem to provide a data communication connection to a corresponding type of telephone line. As another example, communication interface CI may be a local area network (LAN) card to provide a data communication connection to a compatible LAN. Wireless links may also be implemented. In any such implementation, communication interface CI sends and receives electrical, electromagnetic or optical signals that carry digital data streams representing various types of information.

Network link NDL typically provides data communication through one or more networks to other data devices. For example, network link NDL may provide a connection through local network LAN to a host computer HC. This can include data communication services provided through the worldwide packet data communication network, now commonly referred to as the "Internet" INT. Local network LAN (Internet) both use electrical, electromagnetic or optical signals that carry digital data streams. The signals through the various networks and the signals on network data link NDL and through communication interface CI, which carry the digital data to and from computer system CS, are exemplary forms of carrier waves transporting the information.

Computer system CS can send messages and receive data, including program code, through the network(s), network data link NDL, and communication interface CI. In the Internet example, host computer HC might transmit a requested code for an application program through Internet INT, network data link NDL, local network LAN and communication interface CI. One such downloaded application may provide all or part of a method described herein, for example. The received code may be executed by processor PRO as it is received, and/or stored in storage device SD, or other non-volatile storage for later execution. In this manner, computer system CS may obtain application code in the form of a carrier wave.

Figure 12:
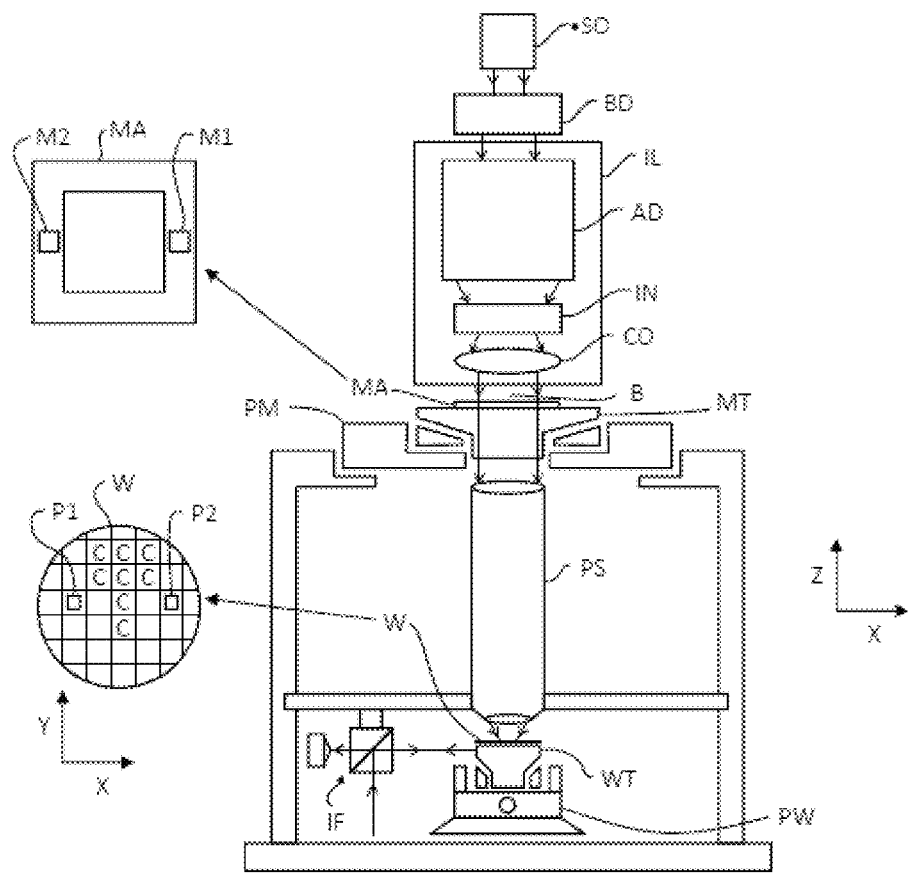
FIG. 12 is a schematic diagram of a lithographic projection apparatus, according to an embodiment.

FIG. 12 is a schematic diagram of a lithographic projection apparatus, according to an embodiment.

The lithographic projection apparatus can include an illumination system IL, a first object table MT, a second object table WT, and a projection system PS.

The illumination system IL can condition a beam B of radiation. In this particular case, the illumination system also comprises a radiation source SO.

The first object table (e.g., patterning device table) MT can be provided with a patterning device holder to hold a patterning device MA (e.g., a reticle), and connected to a first positioner to accurately position the patterning device with respect to item PS.

The second object table (substrate table) WT can be provided with a substrate holder to hold a substrate W (e.g., a resist-coated silicon wafer), and connected to a second positioner to accurately position the substrate with respect to item PS.

The projection system ("lens") PS (e.g., a refractive, catoptric or catadioptric optical system) can image an irradiated portion of the patterning device MA onto a target portion C (e.g., comprising one or more dies) of the substrate W.

As depicted herein, the apparatus can be of a transmissive type (i.e., has a transmissive patterning device). However, in general, it may also be of a reflective type, for example (with a reflective patterning device). The apparatus may employ a different kind of patterning device to classic mask; examples include a programmable mirror array or LCD matrix.

The source SO (e.g., a mercury lamp or excimer laser, LPP (laser produced plasma) EUV source) produces a beam of radiation. This beam is fed into an illumination system (illuminator) IL, either directly or after having traversed conditioning apparatuses, such as a beam expander Ex, for example. The illuminator IL may comprise adjusting device AD for setting the outer and/or inner radial extent (commonly referred to as σ-outer and σ-inner, respectively) of the intensity distribution in the beam. In addition, it will generally comprise various other components, such as an integrator IN and a condenser CO. In this way, the beam B impinging on the patterning device MA has a desired uniformity and intensity distribution in its cross-section.

In some embodiments, source SO may be within the housing of the lithographic projection apparatus (as is often the case when source SO is a mercury lamp, for example), but that it may also be remote from the lithographic projection apparatus, the radiation beam that it produces being led into the apparatus (e.g., with the aid of suitable directing mirrors); this latter scenario can be the case when source SO is an excimer laser (e.g., based on KrF, ArF or $F_2$ lasing).

The beam PB can subsequently intercept patterning device MA, which is held on a patterning device table MT. Having traversed patterning device MA, the beam B can pass through the lens PL, which focuses beam B onto target portion C of substrate W. With the aid of the second positioning apparatus (and interferometric measuring apparatus IF), the substrate table WT can be moved accurately, e.g. so as to position different target portions C in the path of beam PB. Similarly, the first positioning apparatus can be used to accurately position patterning device MA with respect to the path of beam B, e.g., after mechanical retrieval of the patterning device MA from a patterning device library, or during a scan. In general, movement of the object tables MT, WT can be realized with the aid of a long-stroke module (coarse positioning) and a short-stroke module (fine positioning). However, in the case of a stepper (as opposed to a step-and-scan tool) patterning device table MT may just be connected to a short stroke actuator, or may be fixed.

The depicted tool can be used in two different modes, step mode and scan mode. In step mode, patterning device table MT is kept essentially stationary, and an entire patterning device image is projected in one go (i.e., a single "flash") onto a target portion C. Substrate table WT can be shifted in the x and/or y directions so that a different target portion C can be irradiated by beam PB.

In scan mode, essentially the same scenario applies, except that a given target portion C is not exposed in a single "flash." Instead, patterning device table MT is movable in a given direction (the so-called "scan direction", e.g., the y direction) with a speed v, so that projection beam B is caused to scan over a patterning device image; concurrently, substrate table WT is simultaneously moved in the same or opposite direction at a speed V=Mv, in which M is the magnification of the lens PL (typically, M=¼ or ⅕). In this manner, a relatively large target portion C can be exposed, without having to compromise on resolution.

Figure 13:
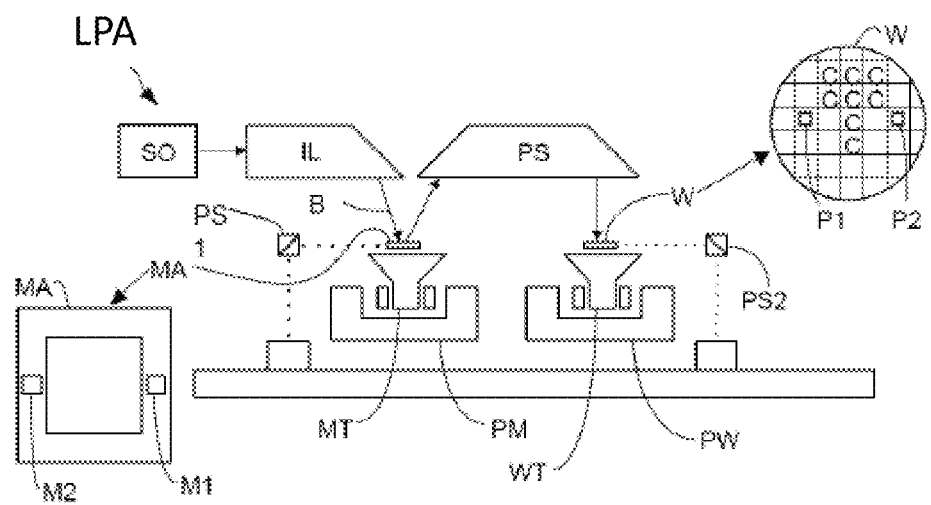
FIG. 13 is a schematic diagram of another lithographic projection apparatus, according to an embodiment.

FIG. 13 is a schematic diagram of another lithographic projection apparatus (LPA), according to an embodiment.

The lithographic projection apparatus can include a source collector module SO, an illumination system (illuminator) IL configured to condition a radiation beam B (e.g. EUV radiation), a support structure MT, a substrate table WT, and a projection system PS.

The support structure (e.g. a patterning device table) MT can be constructed to support a patterning device (e.g. a mask or a reticle) MA and connected to a first positioner PM configured to accurately position the patterning device;

The substrate table (e.g. a wafer table) WT can be constructed to hold a substrate (e.g. a resist coated wafer) W and connected to a second positioner PW configured to accurately position the substrate.

The projection system (e.g. a reflective projection system) PS can be configured to project a pattern imparted to the radiation beam B by patterning device MA onto a target portion C (e.g. comprising one or more dies) of the substrate W.

As here depicted, the lithographic projection apparatus can be of a reflective type (e.g. employing a reflective patterning device). It is to be noted that because most materials are absorptive within the EUV wavelength range, the patterning device may have multilayer reflectors comprising, for example, a multi-stack of molybdenum and silicon. In one example, the multi-stack reflector has a 40 layer pairs of molybdenum and silicon where the thickness of each layer is a quarter wavelength. Even smaller wavelengths may be produced with X-ray lithography. Since most material is absorptive at EUV and x-ray wavelengths, a thin piece of patterned absorbing material on the patterning device topography (e.g., a TaN absorber on top of the multi-layer reflector) defines where features would print (positive resist) or not print (negative resist).

The illuminator IL can receive an extreme ultra violet radiation beam from source collector module SO. Methods to produce EUV radiation include, but are not necessarily limited to, converting a material into a plasma state that has at least one element, e.g., xenon, lithium or tin, with one or more emission lines in the EUV range. In one such method, often termed laser produced plasma ("LPP") the plasma can be produced by irradiating a fuel, such as a droplet, stream or cluster of material having the line-emitting element, with a laser beam. Source collector module SO may be part of an EUV radiation system including a laser for providing the laser beam exciting the fuel. The resulting plasma emits output radiation, e.g., EUV radiation, which is collected using a radiation collector, disposed in the source collector module. The laser and the source collector module may be separate entities, for example when a CO2 laser is used to provide the laser beam for fuel excitation.

In such cases, the laser may not be considered to form part of the lithographic apparatus and the radiation beam can be passed from the laser to the source collector module with the aid of a beam delivery system comprising, for example, suitable directing mirrors and/or a beam expander. In other cases, the source may be an integral part of the source collector module, for example when the source is a discharge produced plasma EUV generator, often termed as a DPP source.

The illuminator IL may comprise an adjuster for adjusting the angular intensity distribution of the radiation beam. Generally, at least the outer and/or inner radial extent (commonly referred to as σ-outer and σ-inner, respectively) of the intensity distribution in a pupil plane of the illuminator can be adjusted. In addition, the illuminator IL may comprise various other components, such as facetted field and pupil mirror devices. The illuminator may be used to condition the radiation beam, to have a desired uniformity and intensity distribution in its cross section.

The radiation beam B can be incident on the patterning device (e.g., mask) MA, which is held on the support structure (e.g., patterning device table) MT, and is patterned by the patterning device. After being reflected from the patterning device (e.g. mask) MA, the radiation beam B passes through the projection system PS, which focuses the beam onto a target portion C of the substrate W. With the aid of the second positioner PW and position sensor PS2 (e.g. an interferometric device, linear encoder or capacitive sensor), the substrate table WT can be moved accurately, e.g. so as to position different target portions C in the path of radiation beam B. Similarly, the first positioner PM and another position sensor PS1 can be used to accurately position the patterning device (e.g. mask) MA with respect to the path of the radiation beam B. Patterning device (e.g. mask) MA and substrate W may be aligned using patterning device alignment marks M1, M2 and substrate alignment marks P1, P2.

The depicted lithographic projection apparatus could be used in at least one of the following modes, step mode, scan mode, and stationary mode.

In step mode, the support structure (e.g. patterning device table) MT and the substrate table WT are kept essentially stationary, while an entire pattern imparted to the radiation beam is projected onto a target portion C at one time (i.e. a single static exposure). The substrate table WT is then shifted in the x and/or Y direction so that a different target portion C can be exposed.

In scan mode, the support structure (e.g. patterning device table) MT and the substrate table WT are scanned synchronously while a pattern imparted to the radiation beam is projected onto target portion C (i.e. a single dynamic exposure). The velocity and direction of substrate table WT relative to the support structure (e.g. patterning device table) MT may be determined by the (de-)magnification and image reversal characteristics of the projection system PS.

In stationary mode, the support structure (e.g. patterning device table) MT is kept essentially stationary holding a programmable patterning device, and substrate table WT is moved or scanned while a pattern imparted to the radiation beam is projected onto a target portion C. In this mode, generally a pulsed radiation source is employed and the programmable patterning device is updated as required after each movement of the substrate table WT or in between successive radiation pulses during a scan. This mode of operation can be readily applied to maskless lithography that utilizes programmable patterning device, such as a programmable mirror array.

Figure 14:
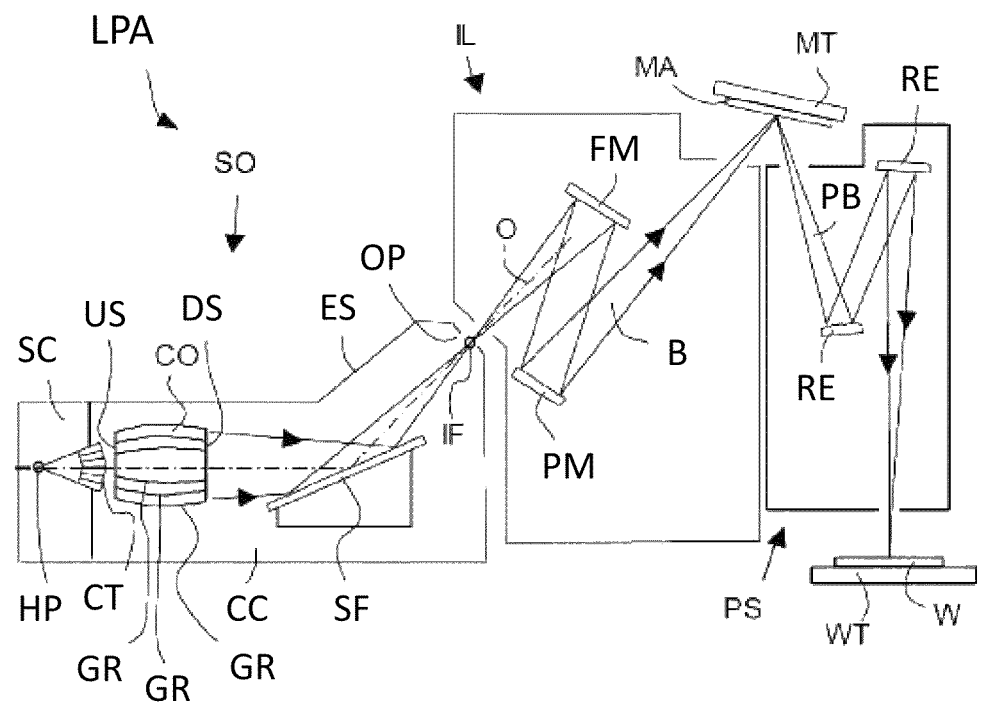
FIG. 14 is a detailed view of the lithographic projection apparatus, according to an embodiment.

FIG. 14 is a detailed view of the lithographic projection apparatus, according to an embodiment.

As shown, the lithographic projection apparatus can include the source collector module SO, the illumination system IL, and the projection system PS. The source collector module SO is constructed and arranged such that a vacuum environment can be maintained in an enclosing structure ES of the source collector module SO. An EUV radiation emitting hot plasma HP may be formed by a discharge produced plasma source. EUV radiation may be produced by a gas or vapor, for example Xe gas, Li vapor or Sn vapor in which the hot plasma HP is created to emit radiation in the EUV range of the electromagnetic spectrum. The hot plasma HP is created by, for example, an electrical discharge causing at least partially ionized plasma. Partial pressures of, for example, 10 Pa of Xe, Li, Sn vapor or any other suitable gas or vapor may be required for efficient generation of the radiation. In an embodiment, a plasma of excited tin (Sn) is provided to produce EUV radiation.

The radiation emitted by the hot plasma HP is passed from a source chamber SC into a collector chamber CC via an optional gas barrier or contaminant trap CT (in some cases also referred to as contaminant barrier or foil trap) which is positioned in or behind an opening in source chamber SC. The contaminant trap CT may include a channel structure. Contamination trap CT may also include a gas barrier or a combination of a gas barrier and a channel structure. The contaminant trap or contaminant barrier CT further indicated herein at least includes a channel structure, as known in the art.

The collector chamber CC may include a radiation collector CO which may be a so-called grazing incidence collector. Radiation collector CO has an upstream radiation collector side US and a downstream radiation collector side DS. Radiation that traverses radiation collector CO can be reflected off a grating spectral filter SF to be focused in a virtual source point IF along the optical axis indicated by the dot-dashed line 'O'. The virtual source point IF can be referred to as the intermediate focus, and the source collector module can be arranged such that the intermediate focus IF is located at or near an opening OP in the enclosing structure ES. The virtual source point IF is an image of the radiation emitting plasma HP.

Subsequently the radiation traverses the illumination system IL, which may include a facetted field mirror device FM and a facetted pupil mirror device pm arranged to provide a desired angular distribution of the radiation beam B, at the patterning device MA, as well as a desired uniformity of radiation amplitude at the patterning device MA. Upon reflection of the beam of radiation B at the patterning device MA, held by the support structure MT, a patterned beam PB is formed and the patterned beam PB is imaged by the projection system PS via reflective elements RE onto a substrate W held by the substrate table WT.

More elements than shown may generally be present in illumination optics unit IL and projection system PS. The grating spectral filter SF may optionally be present, depending upon the type of lithographic apparatus. Further, there may be more mirrors present than those shown in the figures, for example there may be 1-6 additional reflective elements present in the projection system PS.

Collector optic CO can be a nested collector with grazing incidence reflectors GR, just as an example of a collector (or collector mirror). The grazing incidence reflectors GR are disposed axially symmetric around the optical axis O and a collector optic CO of this type may be used in combination with a discharge produced plasma source, often called a DPP source.

Figure 15:
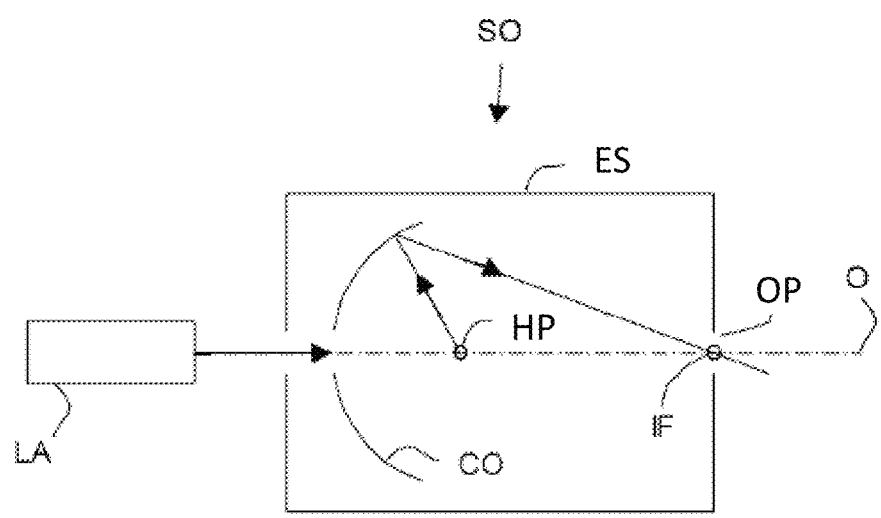
FIG. 15 is a detailed view of the source collector module of the lithographic projection apparatus, according to an embodiment.

FIG. 15 is a detailed view of source collector module SO of lithographic projection apparatus LPA, according to an embodiment.

Source collector module SO may be part of a lithographic projection apparatus radiation system. A laser LA can be arranged to deposit laser energy into a fuel, such as xenon (Xe), tin (Sn) or lithium (Li), creating the highly ionized plasma HP with electron temperatures of several 10's of eV. The energetic radiation generated during de-excitation and recombination of these ions is emitted from the plasma, collected by a near normal incidence collector optic CO and focused onto the opening OP in the enclosing structure ES.

The concepts disclosed herein may simulate or mathematically model any generic imaging system for imaging sub wavelength features and may be especially useful with emerging imaging technologies capable of producing increasingly shorter wavelengths. Emerging technologies already in use include EUV (extreme ultra violet), DUV lithography that is capable of producing a 193 nm wavelength with the use of an ArF laser, and even a 157 nm wavelength with the use of a Fluorine laser. Moreover, EUV lithography is capable of producing wavelengths within a range of 20-50 nm by using a synchrotron or by hitting a material (either solid or a plasma) with high energy electrons in order to produce photons within this range.

Embodiments are provided according to the following clauses:

1. A method of reducing variability of an error associated with a structure on a substrate in a lithography process, the method comprising:
determining, based on an image obtained based on a scan of the substrate by a scanning electron microscope (SEM), a first error due to a SEM distortion in the image;
determining, based on the image, a second error associated with a real error of the structure, where the error associated with the structure comprises the first error and the second error; and
generating, by a data processor, a command that enables a modification of the lithography process and an associated reduction of the variability of the error based on reducing any of the first error or the second error.

2. The method of clause 1, wherein the determining, based on the image obtained based on the scan of the substrate by the SEM, the first error includes determining, based on a plurality of images obtained based on the scan of the substrate by the SEM, the first error; and
wherein the determining, based on the image, the second error associated with the real error of the structure includes determining, based on the plurality of images, the second error associated with the real error of the structure.

3. The method of clause 1, wherein the structure is a main feature or a contact hole.

4. The method of clause 1, wherein the real error is a difference between a feature on the structure and a corresponding feature in a target pattern.

5. The method of clause 4, wherein the feature is any of: an edge placement gauge, a contact hole center, or a critical dimension.

6. The method of clause 1, wherein the SEM distortion is due to any of: an artifact in the electron imaging, vibrations in the SEM system, or artifacts in the electron detection.

7. The method of clause 1, further comprising decomposing the first error into a time-constant error or a time-dependent error.

8. The method of clause 1, further comprising removing any of the time-constant error or the time-dependent error from the first error to reduce the error.

9. The method of clause 1, wherein the first error or the second error are mean square errors and wherein the variability of the error is a standard deviation of the error or a variance of the error.

10. The method of clause 1, further comprising:
generating, with an edge detection algorithm, a contour on a portion of the structure; and
determining the error based on a difference between the contour and a corresponding feature in a target pattern.

11. The method of clause 1, wherein the error is determined in part by averaging a plurality of local errors corresponding to a plurality of neighboring features in a field of view of the SEM.

12. The method of clause 11, wherein the local errors are weighted according to a weighted average of the plurality of local errors and centered at a center of the plurality of neighboring features.

13. The method of clause 11, wherein the local errors are weighted according to a Gaussian distribution centered at a center of the plurality of neighboring features.

14. The method of clause 1, further comprising:
generating a real residual displacement by at least removing the first error associated with the SEM distortion; and flagging a feature of the structure when a portion of the real residual displacement associated with the feature exceeds a threshold.

15. The method of clause 1, further comprising:
monitoring, with the data processor or another data processor, a plurality of images acquired by the SEM;
determining whether the error exceeds a threshold; and
generating, when the threshold is exceeded, any one or more selected from: an alert to a user to recalibrate the SEM, a command causing the SEM to automatically recalibrate, or an instruction that modifies the operation of the SEM to reduce the error.

16. The method of clause 1, the modifying of the lithography process comprising any of: changing a focus of a light source used to manufacture the substrate, modifying parameters used in a source-mask optimization, modifying a number of light sources used in the lithography process, or modifying a configuration of mirrors on a digital mirror device.

17. A method of reducing variability of an error associated with a structure on a substrate in a lithography process, the method comprising:
determining, based on an image obtained based on a scan of the substrate by a scanning electron microscope (SEM), a first error due to a SEM distortion in the image; and
generating, by a data processor, a command that enables a modification of the lithography process and an associated reduction of the variability of the error based on reducing the first error.

18. A computer program product comprising a non-transitory computer readable medium having instructions recorded thereon, the instructions when executed by a computer implementing the method of any of clauses 1-17.

19. A system comprising:
a scanning electron microscope (SEM) configured to scan a substrate with an electron beam and generate an image of the substrate, the image indicating an error associated with a structure on the substrate; and
a non-transitory machine-readable medium storing instructions which, when executed by a data processor, cause the data processor to perform operations comprising:
determining, based on the image obtained based on the scan of the substrate by the SEM, a first error due to a SEM distortion in the image; and
generating, by the data processor, a command that enables a modification of a lithography process and an associated reduction of a variability of the error based on reducing the first error.

20. The system of clause 19, the operations further comprising:
determining, based on the image, a second error associated with a real error of the structure, where the error associated with the structure comprises the first error and the second error,
wherein the command enables the modification of the lithography process and the associated reduction of the variability of the error based on reducing any of the first error or the second error.

21. The system of clause 19, the operations further comprising adjusting, by the data processor, an operational parameter of the SEM to reduce an effect of a lens aberration, wherein the operational parameter can be any of: a beam energy, a focus of the SEM beam, or a scan speed, and wherein the reducing of the effect causes the associated reduction in the variability of the error.

22. The system of clause 19, the operations further comprising automatically refining, by the data processor, a positioning grid calibration of the SEM in response to analysis of the SEM distortion.

23. The system of clause 19, the operations further comprising generating, by the data processor, a command that causes an automatic recalibration of the SEM.

While the concepts disclosed herein may be used for imaging on a substrate such as a silicon wafer, it shall be understood that the disclosed concepts may be used with any type of lithographic imaging systems, e.g., those used for imaging on substrates other than silicon wafers.

As used herein, unless specifically stated otherwise, the term "or" encompasses all possible combinations, except where infeasible. For example, if it is stated that a database can include A or B, then, unless specifically stated otherwise or infeasible, the database can include A, or B, or A and B. As a second example, if it is stated that a database can include A, B, or C, then, unless specifically stated otherwise or infeasible, the database can include A, or B, or C, or A and B, or A and C, or B and C, or A and B and C.

The descriptions above are intended to be illustrative, not limiting. Thus, it will be apparent to one skilled in the art that modifications may be made as described without departing from the scope of the claims set out below.

The invention claimed is:

1. A method comprising:
determining, based on an image obtained based on a measurement of a substrate by a scanning electron microscope (SEM), a first error due to a SEM distortion in the image;
determining, based on the image, a second error associated with a real error of a structure on the substrate, where the error associated with the structure in a lithography process comprises the first error and the second error; and
generating, by a data processor, a command that enables a modification of the lithography process and an associated reduction of a variability of the error associated with the structure based on reducing any of the first error or the second error, wherein the error is determined in part by averaging a plurality of local errors corresponding to a plurality of neighboring features in a field of view of the SEM.

2. The method of claim 1, wherein the determining, based on the image, the first error includes determining, based on a plurality of images obtained based on the measurement of the substrate by the SEM, the first error, and/or
wherein the determining, based on the image, the second error includes determining, based on the plurality of images, the second error.

3. The method of claim 1, wherein the real error is a difference between a feature on the structure and a corresponding feature in a target pattern.

4. The method of claim 3, wherein the feature is any selected from: an edge placement gauge, a contact hole center, or a critical dimension.

5. The method of claim 1, wherein the SEM distortion is due to any selected from: an artifact in electron imaging, vibration in the SEM system, or an artifact in electron detection.

6. The method of claim 1, further comprising decomposing the first error into a time-constant error or a time-dependent error.

7. The method of claim 6, further comprising removing any of the time-constant error or time-dependent error from the first error to reduce the error.

8. The method of claim 1, wherein the first error or the second error is mean square error and wherein the variability of the error is a standard deviation of the error or a variance of the error.

9. The method of claim 1, further comprising:
generating, with an edge detection algorithm, a contour on a portion of the structure; and
determining the error based on a difference between the contour and a corresponding feature in a target pattern.

10. The method of claim 9, wherein the local errors are weighted according to a weighted average of the plurality of local errors and centered at a center of the plurality of neighboring features, or the local errors are weighted according to a Gaussian distribution centered at a center of the plurality of neighboring features.

11. The method of claim 1, further comprising:
generating a real residual displacement by at least removing the first error associated with the SEM distortion; and
flagging a feature of the structure when a portion of the real residual displacement associated with the feature exceeds a threshold.

12. The method of claim 1, further comprising:
monitoring a plurality of images acquired by the SEM;
determining whether the error exceeds a threshold; and
generating, when the threshold is exceeded, any one or more selected from: an alert to a user to recalibrate the SEM, a command causing the SEM to automatically recalibrate, or an instruction that modifies the operation of the SEM to reduce the error.

13. The method of claim 1, wherein the modification of the lithography process comprising any selected from: changing a focus of radiation used to manufacture the substrate, modifying a parameter used in a source-mask optimization, modifying a number of radiation sources used in the lithography process, or modifying a configuration of a mirror on a digital mirror device.

14. A computer program product comprising a non-transitory computer readable medium having instructions therein, the instructions, upon execution by a computer system, configured to cause the computer system to at least:
determine, based on an image obtained based on a measurement of a substrate by a scanning electron microscope (SEM), a first error due to a SEM distortion in the image;
determine, based on the image, a second error associated with a real error of a structure on the substrate, where the error associated with the structure in a lithography process comprises the first error and the second error; and
generate a command that enables a modification of the lithography process and an associated reduction of a variability of the error associated with the structure based on reducing any of the first error or the second error, wherein the error is determined in part by averaging a plurality of local errors corresponding to a plurality of neighboring features in a field of view of the SEM.

15. The computer program product of claim 14, wherein the real error is a difference between a feature on the structure and a corresponding feature in a target pattern and wherein the feature is any selected from: an edge placement gauge, a contact hole center, or a critical dimension.

16. The computer program product of claim 14, wherein the SEM distortion is due to any selected from: an artifact in electron imaging, vibration in the SEM system, or an artifact in electron detection.

17. A system comprising:
a scanning electron microscope (SEM) configured to scan a substrate with an electron beam and generate an image of the substrate, the image indicating an error associated with a structure on the substrate; and
the computer program product of claim 14.

18. A computer program product comprising a non-transitory computer readable medium having instructions therein, the instructions, upon execution by a computer system, configured to cause the computer system to at least:
determine, based on an image obtained based on a measurement by a scanning electron microscope (SEM), a first error due to a SEM distortion in the image, wherein the image indicates an error associated with a structure on the substrate; and
generate a command that enables a modification of a lithography process and an associated reduction of a variability of the error associated with the structure on the substrate based on reducing the first error.

19. The computer program product of claim 18, wherein the instructions are further configured to cause the computer system to:
determine, based on the image, a second error associated with a real error of the structure, where the error associated with the structure comprises the first error and the second error,
wherein the command enables the modification of the lithography process and the associated reduction of the variability of the error based on reducing the first error or the second error, and
wherein the error is determined in part by averaging a plurality of local errors corresponding to a plurality of neighboring features in a field of view of the SEM.

20. A system comprising:
a scanning electron microscope (SEM) configured to scan a substrate with an electron beam and generate an image of the substrate, the image indicating an error associated with a structure on the substrate; and
the computer program product of claim 18.

* * * * *